(12) United States Patent
Bharathan et al.

(10) Patent No.: US 7,679,203 B2
(45) Date of Patent: Mar. 16, 2010

(54) METHODS OF FORMING THERMOELECTRIC DEVICES USING ISLANDS OF THERMOELECTRIC MATERIAL AND RELATED STRUCTURES

(75) Inventors: Jayesh Bharathan, Cary, NC (US); David A. Koester, Burlington, NC (US); Randall G. Alley, Raleigh, NC (US); Rama Venkatasubramanian, Cary, NC (US); Pratima Addepalli, Monroe, MI (US); Bing Shen, Apex, NC (US); Cynthia Watkins, Dunn, NC (US)

(73) Assignee: Nextreme Thermal Solutions, Inc., Durham, NC (US)

( * ) Notice: Subject to any disclaimer, the term of this patent is extended or adjusted under 35 U.S.C. 154(b) by 264 days.

(21) Appl. No.: 11/681,303

(22) Filed: Mar. 2, 2007

(65) Prior Publication Data
US 2007/0215194 A1    Sep. 20, 2007

Related U.S. Application Data

(60) Provisional application No. 60/779,210, filed on Mar. 3, 2006.

(51) Int. Cl.
*H01L 37/00* (2006.01)
(52) U.S. Cl. ............... 257/930; 257/E27.008; 136/200; 136/230
(58) Field of Classification Search ............... 257/930, 257/E27.008; 136/200, 230
See application file for complete search history.

(56) References Cited

U.S. PATENT DOCUMENTS

| | | | |
|---|---|---|---|
| 3,136,134 A | 6/1964 | Smith | |
| 3,296,034 A | 1/1967 | Reich | |
| 3,607,444 A | 9/1971 | Debucs | |
| 3,663,307 A | 5/1972 | Mole | |
| 4,443,650 A | 4/1984 | Takagi et al. | |
| 5,006,178 A | 4/1991 | Bijvoets | |
| 5,254,178 A | 10/1993 | Yamada et al. | |
| 5,430,322 A | 7/1995 | Koyanagi et al. | |
| 5,837,929 A | 11/1998 | Adelman | |
| 5,865,975 A | 2/1999 | Bishop | |

(Continued)

FOREIGN PATENT DOCUMENTS

EP    0 687 020    12/1995

(Continued)

OTHER PUBLICATIONS

US 6,381,965, 05/2002, (withdrawn).

(Continued)

*Primary Examiner*—Tan N Tran
(74) *Attorney, Agent, or Firm*—Myers Bigel Sibley & Sajovec, P.A.

(57) ABSTRACT

A method of forming a thermoelectric device may include forming a plurality of islands of thermoelectric material on a deposition substrate. The plurality of islands of thermoelectric material may be bonded to a header substrate so that the plurality of islands are between the deposition substrate and the header substrate. More particularly, the islands of thermoelectric material may be epitaxial islands of thermoelectric material having crystal structures aligned with a crystal structure of the deposition substrate. Related structures are also discussed.

21 Claims, 23 Drawing Sheets

U.S. PATENT DOCUMENTS

| | | | |
|---|---|---|---|
| 5,869,242 | A | 2/1999 | Kamb |
| 5,874,219 | A | 2/1999 | Rava et al. |
| 5,897,330 | A | 4/1999 | Watanabe et al. |
| 5,900,071 | A | 5/1999 | Harman |
| 5,922,988 | A | 7/1999 | Nishimoto |
| 6,060,331 | A | 5/2000 | Shakouri et al. |
| 6,060,657 | A | 5/2000 | Harman |
| 6,062,681 | A | 5/2000 | Field et al. |
| 6,071,351 | A | 6/2000 | Venkatasubramanian |
| 6,072,925 | A | 6/2000 | Sakata |
| 6,084,050 | A | 7/2000 | Ooba et al. |
| 6,094,919 | A | 8/2000 | Bhatia |
| 6,154,266 | A | 11/2000 | Okamoto et al. |
| 6,154,479 | A | 11/2000 | Yoshikawa et al. |
| 6,180,351 | B1 | 1/2001 | Cattell |
| 6,271,459 | B1 | 8/2001 | Yoo |
| 6,282,907 | B1 | 9/2001 | Ghoshal |
| 6,300,150 | B1 | 10/2001 | Venkatasubramanian |
| 6,365,821 | B1 | 4/2002 | Prasher |
| 6,384,312 | B1 | 5/2002 | Ghoshal et al. |
| 6,403,876 | B1 | 6/2002 | Ghoshal et al. |
| 6,410,971 | B1 | 6/2002 | Otey |
| 6,412,286 | B1 | 7/2002 | Park et al. |
| 6,424,533 | B1 | 7/2002 | Chu et al. |
| 6,505,468 | B2 | 1/2003 | Venkatasubramanian |
| 6,605,772 | B2 | 8/2003 | Harman et al. |
| 6,662,570 | B2 | 12/2003 | Venkatasubramanian |
| 6,696,635 | B2 | 2/2004 | Prasher |
| 6,717,237 | B2 * | 4/2004 | Chen et al. ............... 257/594 |
| 6,722,140 | B2 | 4/2004 | Venkatasubramanian |
| 6,818,470 | B1 | 11/2004 | Acklin et al. |
| 6,826,916 | B2 | 12/2004 | Shimada |
| 6,867,978 | B2 | 3/2005 | Whittenburg et al. |
| 7,005,320 | B2 | 2/2006 | Kwon |
| 7,005,738 | B2 | 2/2006 | Zuo et al. |
| 7,009,289 | B2 | 3/2006 | Hu et al. |
| 7,038,316 | B2 | 5/2006 | Hu et al. |
| 2001/0052234 | A1 | 12/2001 | Venkatasubramanian |
| 2002/0053359 | A1 | 5/2002 | Harman et al. |
| 2002/0069906 | A1 | 6/2002 | Macris |
| 2002/0139123 | A1 | 10/2002 | Bell |
| 2002/0174660 | A1 | 11/2002 | Venkatasubramanian |
| 2003/0099279 | A1 | 5/2003 | Venkatasubramanian et al. |
| 2003/0100137 | A1 | 5/2003 | Venkatasubramanian |
| 2003/0126865 | A1 | 7/2003 | Venkatasubramanian |
| 2003/0131609 | A1 | 7/2003 | Venkatasubramanian |
| 2003/0230332 | A1 | 12/2003 | Venkatasubramanian et al. |
| 2006/0086118 | A1 | 4/2006 | Venkatasubramanian et al. |
| 2006/0289050 | A1 | 12/2006 | Alley et al. |
| 2007/0028956 | A1 | 2/2007 | Venkatasubramanian et al. |

FOREIGN PATENT DOCUMENTS

| | | |
|---|---|---|
| EP | 0 805 501 | 11/1997 |
| EP | 1 079 445 A2 | 2/2001 |
| JP | 6-97512 | 4/1994 |
| WO | WO98/43740 | 10/1998 |
| WO | WO98/44562 | 10/1998 |
| WO | WO 00/49664 | 8/2000 |
| WO | WO 01/08800 | 2/2001 |
| WO | WO 2004/105146 A1 | 12/2004 |
| WO | WO 2007/002337 A2 | 1/2007 |
| WO | WO 2007/002342 A2 | 1/2007 |

OTHER PUBLICATIONS

Development of Low-Bandgap Ge and $Sl_{0.07}Ge_{0.03}$ Solar Cells for Monolithic and Mechanically-Stacked Cascade Applications, Rama Venkatasubramanian et al., pp. 73-78.

Fields, S., Proteomics In Genomeland, Science vol. 291 No. 5507 pp. 1221-1224, pp. 1-7.

Graded-Band-GAP AlGaAs Solar Cells For AlGaAs/Ge Cascade Cells, M.L. Timmons, et al., pp. 68-72.

Fitch, J. Patrick, Bahrand Sokhansanj, IEEE, Genomic Engineering: Moving Beyond DNA Sequence to Function, Proceedings of the IEEE, vol. 88, No. 12, Dec. 2000, pp. 1949-1971.

Hofmeister, Rudolf et al., New Photorefractive Mechanism in Centrosymmetric Crystals: A Strain-Coordinated Jahn-Teller Relaxation, Physical Review Letters, vol. 69, No. 9, Aug. 31, 1992, pp. 1459-1462.

Samuel K. Moore, Making Chips, IEEE Spectrum, Biotechnology, Mar. 2001, pp. 54-60.

Photoexcited Carrier Lifetimes and Spatial Transport in Surface-free GaAS Homostructures, L.M. Smith et al., J. Vac. Sci. Technol. B, vol. 8, No. 4 Jul./Aug. 1990, pp. 787-792.

Ideal Electronic Properties of a p-Ge/p-$Al_{0.85}Ga_{0.15}$As Interface, Rama Venkatasubramanian et al., Appl. Phys. Lett., vol. 59, No. 3, Jul. 15, 1991, pp. 318-320.

Selective Plasma Etching of Ge Substrates for Thin Freestanding GaAs-AlGaAs Heterostructures, Rama Venkatasubramanian et al., Appl. Phys. Lett., vol. 59, No. 17, Oct. 21, 1991, pp. 2153-2155.

Visible Light Emission From Quantized Planar Ge Structures, Rama Venkatasubramanian et al., Appl. Phys. Lett., vol. 59, No. 13, Sep. 23, 1991, pp. 1603-1605.

GaInAsP Lattice Matched to GaAs for Solar Cell Applications, P.R. Sharps, et al., Research Triangle Institute, P.O. Box 12194, RTP, NC 27709. pp. 315-317.

High-Temperature Performance and Radiation Resistance of High-Efficiency Ge and $Si_{0.07}Ge_{0.03}$ Solar Cells on Lightweight Ge Substrates, Rama Venkatasubramanian et al., pp. 85-98.

Physical Basis and Characteristics of Light Emission From Quantized Planar Ge Structures, Rama Venkatasubramanian, et al., pp. 15.4.1-15.4.4.

High Quality GaAs on Si Using $Si_{0.04}Ge_{0.96}$/Ge Buffer Layers, Rama Venkatasbramanian, et al., Journal of Crystal Growth 107 (1991) pp. 489-493.

The New Face of A.I., Michael Powell, Merger Maniac Europe's CD Underworld, The Supercheap Future of Flying, Mar. 2002, Hacking the Racetrack, Insife Nuke University, Wired, A New Kind of Cool, Rama Venkatasubramanian.

Optimization of the Heteroepitaxy of Ge on GaAs for Minority-Carrier Lifetime, Rama Venkatasubramanian, et al., Journal of Crystal Growth 112 (1991) pp. 7-13.

Intrinsic Recombination and Interface Characterization in "surface-free" GaAs Structures, D.J. Wolford et al., J. Vac. Sci. Technol. B. vol. 9, No. 4, Jul./Aug. 1991, pp. 2369-2376.

Advances in the Development of an AlGaAs/GaAs Cascade Solar Cell Using a Patterned Germanium Tunnel Interconnect, Rama Venkatasubramanian et al., pp. 345-354.

High-Quality Eutectic-Metal-Bonded AlGaAs-GaAs Thin Films on Si Substrates, Rama Venkatasubramanian et al., Appl. Phys. Lett., vol. 60, No. 7, Feb. 17, 1992, pp. 886-888.

Photoluminescence of Porous Silicon Buried Underneath Epitaxial GaP, J.C., Campbell, et al., Appl. Phys. Lett., vol. 60, No. 7, Feb. 17, 1992, pp. 889-891.

Interface-Free GaAs Structures—From Bulk to the Quantum Limit, D.J. Wolford, et al, Inst. Phys. Conf. Ser. No. 120: Chapter 9, pp. 401-406.

Properties and Use of Cycled Grown OMVPE GaAs: Zn, GaAS:Se, and GaAS:Si Layers for High-Conductance GaAS Tunnel Junctions, Rama Venkatasubramanian et al., National Renewable Energy Laboratory, Golden, CO 80401, pp. 893-899.

Thermal Characterization of $Bi_2$, $Te_3$/$Sb_2$ $Te_3$ Superlattices, M.N. Touzelbaev and P. Zhou, Department of Mechanical Engineering, Stanford University, Stanford, California 94305-3030, Rama Venkatasubramanian, Center for Semiconductor Research, Research Triangle Institute, Research Triangle Park, Durham, NC 27709-2195, K.E. Goodson Electronic mail goodson@vk.stanford.edu, Journal of Applied Physics, vol. 90, No. 2, Jul. 15, 2001, pp. 763-767.

Smaller, Faster, Efficient Thermoelectric Cooling, Rama Venkatasubramanian, vol. 30, No. 41, Oct. 17, 2001 ISSN: 0300-757X, pp. 1-2.

CVD Diamond for Components and Emitters, J. Davidson, Corresponding Author, e-mail address: jld@vuse.vanderbilt.edu (J.

Davidson) et al., Vanderbilt University 2201 West End Avenue, Nashville, TN 37235, USA, Diamond and Related Materials 10 (2001) pp. 1736-1742.

Sneak Preview, Optical Device Transfers Data Fast, Rama Venkatasubramanian, design news Dec. 17, 2001. p. 14.

Lattice Thermal Conductivity Reduction and Phonon Localization-like Behavior in Superlattice Structures, Rama Venkatasubramanian, Research Triangle Institute, Research Triangle Park, North Carolina 27709, Physical Review B., vol. 61, No. 4, Jan. 15, 2000-II, pp. 3091-3097.

Phonon-Blocking Electron-Transmitting Structures, Rama Venkatasubramanian et al., Research Triangle Institute, Research Triangle Park, NC, USA, 18 International Conference on Thermoelectric (1999), pp. 100-103.

Magnetoresistance Technique for Determining Cross-Plane Mobility in Superlattice Devices, S.W. Johnson et al., National Renewable Energy Laboratory, Golden, CO, USA, Research Triangle Institute, Research Triangle Park, NC, USA, $18^{th}$ International Conference on Thermoelectrics (1999), pp. 675-686.

RTI Research Yields Major Advance in Thermoelectrics, Rama Venkatasubramanian et al., pp. 8-9.

RTI International, "New Thermoelectric Materials Can Keep Chips Cool Advances in Fiber Optics and in Biotechnology also are Likely" Oct. 9, 2001.

RTI International Annual Report 2001, Turning Knowledge into Practice, pp. 4-37.

Cooling Film Tempers Tiny Hot Spots, Rama Venkatasubramanian et al, Science News, No. 3, 2001, v160, i18, p. 280.

Phonon Blocking Electron Transmitting Superlattice Structures as Advanced Thin Film Thermoelectric Materials, Rama Venkatasubramanian, Research Triangle Institute, Research Triangle Park, NC, Chapter 4, Semiconductors and Semimetals, vol., pp. 175-201.

Improved Photoluminescence of GaAs in ZnSe/GaAs Heterojunctions grown by Organometallic Epitaxy, S.K. Ghandhi et al., Electrical Computer, and Systems Engineering Department, Rensselaer Polytechnic Institute, Troy, New York 12180, Appl. Phys. Lett. vol. 53 No. 14, Oct. 3, 1988, pp. 1308-1310.

Epitaxy of Germanium using Germane in the Presence of Tetramethylgermanium, Rama Venkatasubramanian et al., Research Triangle Institute, P.O. Box 12194, Research Triangle Park, NC, 27709, J. Appl. Phys. vol. 66, No. 11, Dec. 1, 1989, pp. 5662-5664.

Radiative Recombination in Surface free $n^+In^-In^+$ GaAs Homostructures, L.M. Smith and D.J. Wolford et al., Appl. Phys. Lett., vol. 57, No. 15, Oct. 8, 1990, pp. 1572-1574.

Measurement of Al/GaAs/AlGaAs Interface Recombination Velocities Using Time-Resolved Photoluminescence, M.L. Timmons, et al., Appl. Phys. Lett. vol. 56, No. 19, May 7, 1990, pp. 1850-1852.

Thin-Film Thermoelectric Devices with High Room-Temperature Figures of Merit, Rama Venkatasubramanian et al., Research Triangle Institute, Research Triangle Park, North Carolina 27709, USA, 2001 Macmillian Magazines Lt., Nature, vol. 413, Oct. 11, 2001, www.nature.com pags 597-602.

In-situ Monitoring of the Growth of $Bi_2Te_3$ and $Sb_2Te_3$ Superlattice Using Spectroscopic Ellipsometry Hao Cui et al. Journal of Electronic Materials, vol. 30, No. 11 2001, Special Issue Paper, pp. 1376-1381.

Incorporation Processes in MBE Growth of ZnSe, Rama Venkatasubramanian et al., Journal of Crystal Growth 95 (1989) pp. 533-537.

An Inverted-Growth Approach To Development of an IR-Transparent, High-Efficiency AiGaAs/GaAs Cascade Solar Cell, Rama Venkatasubramanian, M.L. Timmons, T.S. Colpitts, J.S. Hills, and J.A. Hutchby, Research Triangle Institute, Research Triangle Park, NC 27709, 1991 IEEE pp. 93-98.

15.8%-Efficient (1-SUN, AM 1.5G) GaAs Solar Cell on Optical-Grade Polycrystalline Ge Substrate, Rama Venkatasubramanian et al., pp. 691-695.

Development of 20% Efficient GainAsP Solar Cells, P.R. Sharps, et. al., 1993 IEEE pp. 633-638.

Development of High-Efficiency $Al_{0.2}Ga_{0.8}As$ Solar Cells and Interconnect Schemes For $Al_{0.2}Ga_{0.3}As$/Si Mechanically-Stacked Cascade Cells, Rama Venkatasubramanian, et al., 1993 IEEE pp. 752-756.

Photoreflectance Characterization of InP and GaAs Solar Cells, R.G. Rodrigues et al., 1993 IEEE pp. 681-685.

Close-Packed Cell Arrays for Dish Concentrators, J.B. Lasich et al., Solar Research Corporation Pty. Ltd., 6 Luton Lane, Hawthorn, Victoria 3122, Australia and M. Timmons et al., Research Triangle Institute, RTP, USA, 1994 IEEE pp. 1938-1941.

GaAs and $Al_{0.2}Ga_{0.8}As$ Solar Cells With An Indirect-Bandgap $Al_{0.8}Ga_{0.2}As$ Emitter—Heterojunction Cells, Rama Venkatasubramanian et al., Research Triangle Institute, RTP, NC 27709, H. Field and K. Emery, National Renewable Energy Laboratory (NREL), Golden, CO 80401, First WCPEC; Dec. 5-9, 1994; Hawaii, pp. 1839-1842.

The Growth and Radiation Response of $N^+p$ Deep Homojunction InP Solar Cells, M.J. Panunto et al., M.L. Timmons, et al., First WCPEC; Dec. 5-9, 1994; Hawaii, pp. 2192-2195.

Material and Device Characterization Toward High-Efficiency GaAs Solar Cells on Optical-Grade Polycrystalline Ge Substrates, Rama Venkatasubramanian, et al., R. Ahrenkiel, et. al, First WCPEC; Dec. 5-0, 1994; Hawaii, 1994 IEEE pp. 1692-1696.

Silicon and GAAS/GE Concentrator Power Plants: A Comparison of Cost of Energy Produced, R.A. Whisnant et al., First WCPEC; Dec. 5-9, 1994; Hawaii, 1994 IEEE pp. 1103-1106.

Compensation Mechanisms in $N^+$-GaAs Doped With Silicon, Rama Venkatasubramanian, et al., Electrical Computer, and Systems Engineering Department, Rensselaer Polytechnic Institute, Troy, New York 12180, USA, Journal of Crystal Growth 94 (1989) pp. 34-40.

High-Efficiency Tandem Solar Cells on Single-and Poly-Crystalline Substrates, J.A. Hutchby et al., Center for Semiconductor Research, Research Triangle Institute, Research Triangle Park, NC 27709, USA, Solar-Energy Materials and Solar Cells 35 (1994) pp. 9-24.

Optoelectronic Properties of Eutectic-Metal-Bonded (EMB) GaAs-AlGaAs Structures on Si Substrates, Rama Venkatasubramanian, et al., Solid-State Electronics vol. 37, No. 11, pp. 1809-1815, 1994.

Heteroepitaxy and Characterization of Ge-rich SiGe Alloys on GaAs, Rama Venkatasubramanian et al., J. Appl. Phys. vol. 69. No. 12, Jun. 15, 1991, pp. 8164-8167.

18.2% (AM1.5) Efficient GaAs Solar Cell on Optical-Grade Polycrystalline Ge Substrate, Rama Venkatasubramanian et al., $25^{th}$ PVSC; May 13-17, 1996; Washington, D.C. 1996 IEEE pp. 31-36.

Experimental Evidence of High Power Factors and Low Thermal Conductivity in $Bi_2Te_3/SB_2Te_3$ Superlattice Thin-Films, Rama Venkatasubramanian et al., Research Triangle Institute, Research Triangle Park, NC 27709, USA, $15^{th}$ International Conference on Thermoelectrics (1996), 1996 IEEE pp. 454-458.

Thermal Conductivity of Si-Ge Superlattices, S.-M. Lee and David G. Cahill[a], Rama Venkatasubramanian, Appl. Phys. Lett. vol. 70, No. 22, Jun. 2, 1997, pp. 2957-2959.

20% (AM1.5) Efficiency GaAs Solar Cells on Sub-mm Grain-Size Poly-Ge and Its Transition to Low-Cost Substrates, Rama Venkatasubramanian et al., $26^{th}$ PVSC: Sep. 30-Oct. 3, 1997; Anaheim, CA 1997 IEEE, pp. 811-814.

Electronic and Mechanical Properties of Ge Films Grown on Glass Substrates, R.K. Ahrenkiel et al., $26^{th}$ PVSC; Sep. 30-Oct. 3, 1997; Anaheim, CA, pp. 527-529.

MOCVD of $Bi_2Te_3$ and Their Superlattice Structures for Thin-Film Thermoelectric Applications, Rama Venkatasubramanian et al., Journal of Crystal Growth 170 (1997), pp. 817-821.

A Silent Cool: Thermoelectrics May Offer New Ways to Refrigerate and Generate Power, Corinna Wu, Science News, Sep. 6, 1997 v152 n10 p. 152(2), pp. 1-3.

ONR Contributes to Thermoelectric Research (Office of Naval Research) (Brief Article), Ozone Depletion Network Online Today, Contact ONR, website http://www.onr.navy.mil., Nov. 2001.

In-Plane Thermoelectric Properties of Freestanding Si/Ge Superlattice Structures, Rama Venkatasubramanian et al., $17^{th}$ International Conference on Thermoelectrics (1998), pp. 191-197.

Potential of Si-based Superlattice Thermoelectric Materials for Integration with Si Microelectronics, Rama Venkatasubramanian et al., 1998 IEEE, p. 869.

Low-temperature Organometallic Epitaxy and Its Application to Superlattice Structures in Thermoelectrics, Rama Venkatasubramanian, [a], et al., Sandra Liu and Nadia El-Masry, Michael Lamvik, Applied Physics Letters, vol. 75, No. 8, Aug. 23, 1999, pp. 1104-1106.

Optical Constants of $Bi_2Te_3$ and $Sb_2Te_3$ Measured Using Spectroscopic Ellipsometry, HAO CUI, [1]I.B. BHAT[1.3] and Rama Venkatasubramanian[2], 1-Electrical, Computer and Systems Engineering Department, Rensselaer Polytechnic Institute, Troy, NY 12180-3590, USA. 2.-Research Triangle Institute, Research Triangle Park, NC 27709, USA, 3-e-mail:bhati@.rpi.edu., Journal of Electronics Materials, vol. 28, No. 10, 1999, pp. 1111-1114.

Thin-Film Technology, Research Triangle Institute, Investment Opportunities, in Thermoelectronics, Apr. 6, 2001, website http://www.rti.org/units/es.cfm, pp. 1-2.

Nature Publishing Group, Materials Update, Cool Future for Semiconductors, Oct. 11, 2001. pp. 1-3.

Cool New Film, Science Update, Oct. 11, 2001, http://www.nature.com/nsu/011011/011011-12.html, pp. 1-2.

Semiconductors are Cool, News and Views, Cronin B. Vining, 2001 Macmillan Magazines Ltd., Nature, vol. 413, Oct. 11, 2001, www.nature.com, pp. 577-578.

Thermoelectric Boost, Richard Babyak, Appliance Manufacturer, Design and Engineering Solutions for the Global Appliance Industry, http://www.ammagazine.com/CDA/ArticleInformation/features/BNP Features Item/0.260 . . . Jul. 18, 2002, pp. 1-2.

Thermoelectrics from Hot to Cool, New Technology Offers Efficient way to Heat or Cool ICS in Operation, Jeff Dorsch, Semiconductor Magazine, http://www.semi.org/web/wmagazine.nsf/4f55b97743c2dO2e882565bf006c2459/27e74866ea..., Jun. 20, 2002, pp. 1-3.

Nanostructured Superlattice Thin-Film Thermoelectric Devices; Nanotechnology and the Environment Applications and Implications; American Chemical Society (2005) (ACS Symposium Series 890) Chapter 47, pp. 347-352.

Grove issues power warning at IEDM lunch; David Lammers (Dec. 10, 2002) http://www.eetimes.com/showArticle.jhtml?articleID = 10806530,; EETIMES online.

Superlattice Thin-film Thermoelectric Materials and Devices; Rama Venkatasubramanian et al.; Mat. Res. Soc. Symp. Proc. vol. 793 (2004 Materials Research Society) pp. 51-58.

1.3 Peltier Cooling and the Thermoelectric Figure of Merit; G.S. Nolas et al.; Thermo-electrics Basic Principles and New Materials Developments; Materials Science; pp. 8-13.

IR-Mediated PCR http://faculty.virginia.edu/landers/Irframe.htm.

Invitation to Pay Additional Fees and Partial International Search Report for PCT/US2007/005490; date of mailing Apr. 10, 2008.

International Search Report and Written Opinion for International Application No. PCT/US2007/005490, mailed Jun. 23, 2008 (17 pages).

* cited by examiner

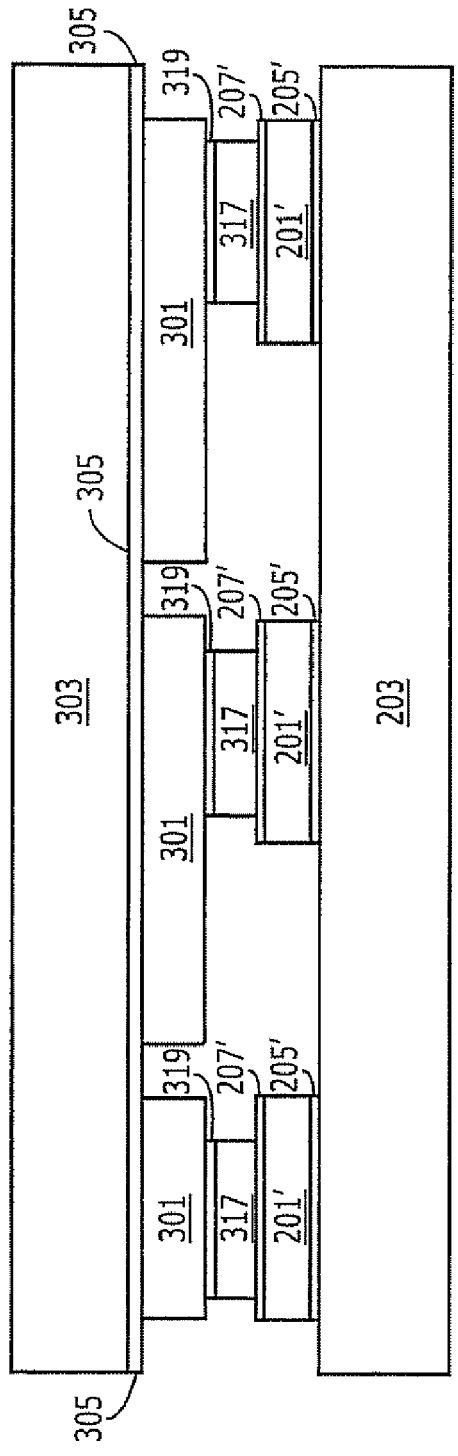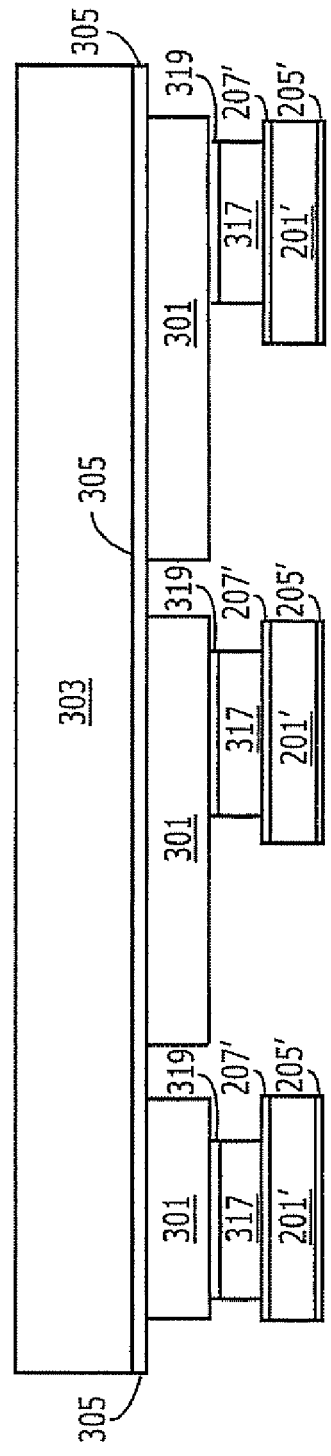
FIGURE 4A
FIGURE 4B

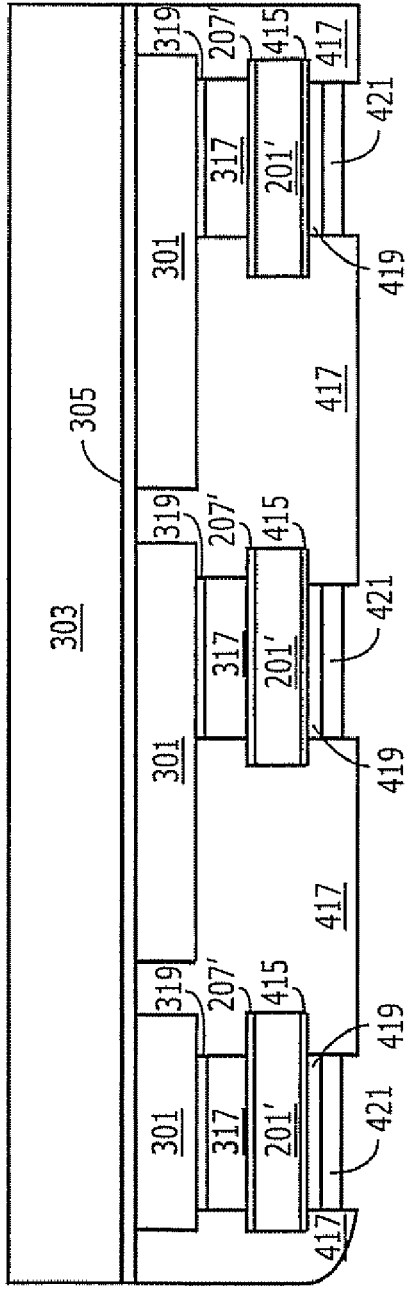
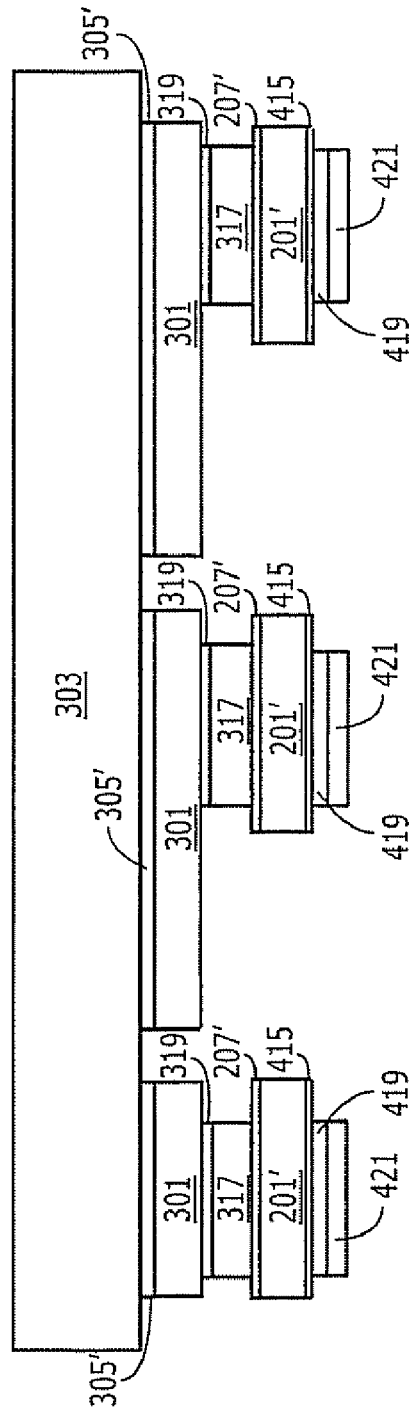
FIGURE 4C
FIGURE 4D

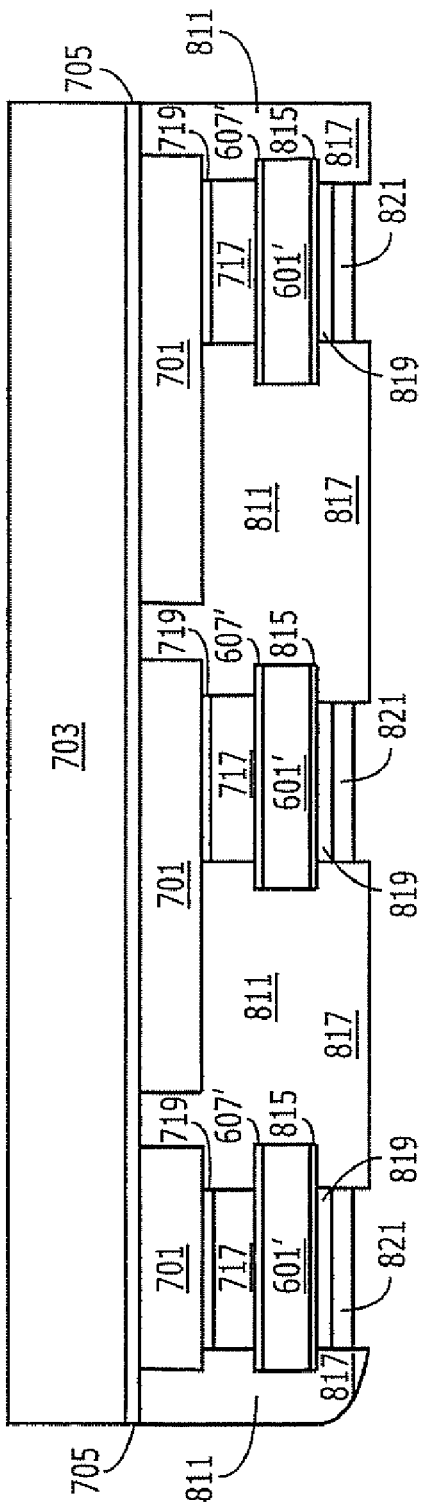
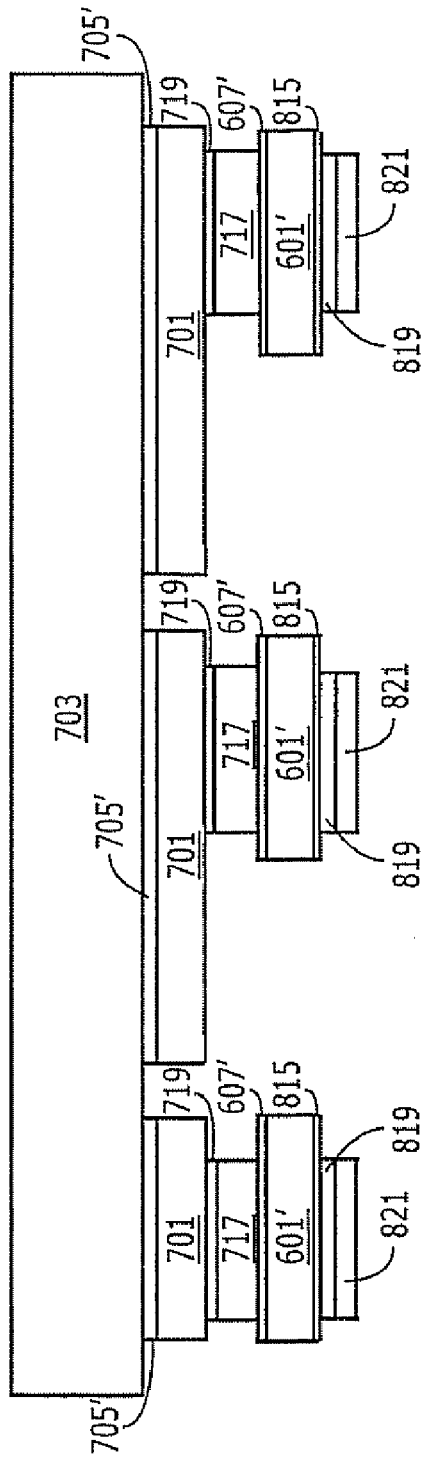
FIGURE 8C
FIGURE 8D

METHODS OF FORMING THERMOELECTRIC DEVICES USING ISLANDS OF THERMOELECTRIC MATERIAL AND RELATED STRUCTURES

RELATED APPLICATIONS

This U.S. non-provisional patent application claims the benefit of priority of U.S. Provisional Application No. 60/779,210, filed on Mar. 3, 2006, the disclosure of which is hereby incorporated herein by reference in its entirety.

FIELD OF THE INVENTION

The present invention generally relates to electronics, and more particularly, to thermoelectric devices and related methods.

BACKGROUND

Thermoelectric materials may be used to provide cooling and/or power generation according to the Peltier effect. Thermoelectric materials are discussed, for example, in the reference by Venkatasubramanian et al. entitled "*Phonon-Blocking Electron-Transmitting Structures*" (18th International Conference On Thermoelectrics, 1999), the disclosure of which is hereby incorporated herein in its entirety by reference.

Application of solid state thermoelectric cooling may be expected to improve the performance of electronics and sensors such as, for example, RF receiver front-ends, infrared (IR) imagers, ultra-sensitive magnetic signature sensors, and/or superconducting electronics. Bulk thermoelectric materials typically based on p-$Bi_xSb_{2-x}Te_3$ and n-$Bi_2Te_{3-x}Se_x$ alloys may have figures-of-merit (ZT) and/or coefficients of performance (COP) which result in relatively poor thermoelectric device performance.

The performance of a thermoelectric device may be a function of the figure(s)-of-merit (ZT) of the thermoelectric material(s) used in the device, with the figure-of-merit being given by:

$$ZT = (\alpha^2 \sigma T / K_T), \quad \text{(equation 1)}$$

where $\alpha$, T, $\sigma$, $K_T$ are the Seebeck coefficient, absolute temperature, electrical conductivity, and total thermal conductivity, respectively. The material-coefficient Z can be expressed in terms of lattice thermal conductivity ($K_L$), electronic thermal conductivity ($K_e$) and carrier mobility ($\mu$), for a given carrier density ($\rho$) and the corresponding $\alpha$, yielding equation (2) below:

$$Z = \alpha^2 \sigma / (K_L + K_e) = \alpha^2 / [K_L / (\mu \rho q) + L_0 T)], \quad \text{(equation 2)}$$

where, $L_0$ is the Lorenz number (approximately $1.5 \times 10^{-8} V^2/K^2$ in non-degenerate semiconductors). State-of-the-art thermoelectric devices may use alloys, such as p-$Bi_xSb_{2-x}Te_{3-y}Se_y$ (x≈0.5, y≈0.12) and n-$Bi_2(Se_yTe_{1-y})_3$ (y≈0.05) for the 200 degree K to 400 degree K temperature range. For certain alloys, $K_L$ may be reduced more strongly than $\mu$ leading to enhanced ZT.

A ZT of 0.75 at 300 degree K in p-type $Bi_xSb_{2-x}Te_3$ (x≈1) was reported forty years ago. See, for example Wright, D. A., Nature vol. 181, pp. 834 (1958). Since then, there has been relatively modest progress in the ZT of thermoelectric materials near 300 degree K (i.e., room temperature). A ZT of about 1.14 at 300 degree K for bulk p-type $(Bi_2Te_3)_{0.25}(Sb_2Te_3)_{0.72}(Sb_2Se_3)_{0.03}$ alloy has been discussed for example, in the reference by Ettenberg et al. entitled "*A New N-Type And Improved P-Type Pseudo-Ternary $(Bi_2Te_3)(Sb_2Te_3)(Sb_2Se_3)$ Alloy For Peltier Cooling*," (Proc. of 15th Inter. Conf. on Thermoelectrics, IEEE Catalog. No. 96TH8169, pp. 52-56, 1996), the disclosure of which is hereby incorporated herein in its entirety by reference.

Thermoelectric devices are discussed, for example, in U.S. Pat. No. 5,837,929 entitled "Microelectronic Thermoelectric Device And Systems Incorporating Such Device," the disclosure of which is hereby incorporated herein in its entirety by reference.

Notwithstanding the above mentioned advances in thermoelectric materials and devices, there continues to exist a need in the art for improved thermoelectric device structures and assembly methods.

SUMMARY

According to some embodiments of the present invention, a method of forming a thermoelectric device may include forming a plurality of islands of thermoelectric material on a deposition substrate. The plurality of islands of thermoelectric material may then be bonded to a header substrate so that the plurality of islands are between the deposition substrate and the header substrate.

More particularly, the plurality of islands of thermoelectric material may be a plurality of epitaxial islands of thermoelectric material, and crystal structures of the plurality of epitaxial islands of thermoelectric material may thus be aligned with a crystal structure of the deposition substrate. In addition, forming the plurality of islands of thermoelectric material on the deposition substrate may include forming a continuous layer of the thermoelectric material on the deposition substrate, and selectively removing portions of the continuous layer of the thermoelectric material on the deposition substrate to expose portions of the deposition substrate between the islands of thermoelectric material.

After bonding the plurality of islands to the header substrate, the deposition substrate may be removed while maintaining the plurality of islands on the header substrate. Moreover, the header substrate may be a first header substrate, and after removing the deposition substrate, the plurality of islands may be bonded to a second header substrate so that the plurality of islands are between the first and second header substrates. The first and second header substrates may be substrates of different materials, and one of the first and second header substrates may be removed from the plurality of islands while maintaining another of the first and second header substrates on the plurality of islands.

A support material may be provided between the first and second headers with the support material providing mechanical coupling between the plurality of islands, and the support material may be electrically insulating. After providing the support material, the first header substrate and/or the second header substrate may be removed from the plurality of islands while maintaining the support material providing mechanical coupling between the plurality of islands.

The plurality of islands may be a first plurality of islands, the deposition substrate may be a first deposition substrate, and the header substrate may be a first header substrate. In addition, a second plurality of islands of thermoelectric material may be formed on a second deposition substrate. The second plurality of islands of thermoelectric material may be bonded to a second header substrate so that the second plurality of islands are between the second deposition substrate and the second header substrate. After bonding the second plurality of islands to the second header substrate, the second deposition substrate may be removed while maintaining the second plurality of islands on the second header substrate. After removing the first and second deposition substrates, the first plurality of islands my be bonded to the second header substrate and the second plurality of islands may be bonded to the first header substrate so that the first and second pluralities of islands are between the first and second header substrates.

The first plurality of islands of thermoelectric material may have a first conductivity type, and the second plurality of islands of thermoelectric material may have a second conductivity type opposite the first conductivity type. After bonding the first plurality of islands to the second header substrate and after bonding the second plurality of islands to the first header substrate, one of the first header substrate and/or the second header substrate may be removed from the first and second pluralities of islands. Another of the first and second header substrates may be maintained on the first and second pluralities of islands after removing the one of the first and second header substrates.

A support material may be provided between the first and second header substrates with the support material providing mechanical coupling between the first and second pluralities of islands, and the support material may be electrically insulating. After providing the support material, the first header substrate and/or the second header substrate may be removed from the first and second pluralities of islands while maintaining the support material providing mechanical coupling between the first and second pluralities of islands.

The first header substrate may include a first plurality of conductive traces on a surface thereof, and the second header substrate may include a second plurality of conductive traces on a surface thereof. Bonding the first plurality of islands to the first header substrate may include bonding the first plurality of islands to the first plurality of conductive traces, and bonding the second plurality of islands to the second header substrate may include bonding the second plurality of islands to the second plurality of conductive traces. Alternating ones of the first and second pluralities of islands may be electrically connected in series through the first and second plurality of conductive traces after bonding the first plurality of islands to the second header substrate and after bonding the second plurality of islands to the first header substrate.

Bonding the first plurality of islands of thermoelectric material to the first header substrate may include solder bonding the first plurality of islands to the first header substrate, and bonding the second plurality of islands of thermoelectric material to the second header substrate may include solder bonding the second plurality of islands to the second header substrate. Moreover, the deposition substrate and the header substrate may be substrates of different materials.

According to some other embodiments of the present invention, a thermoelectric structure may include a plurality of islands of thermoelectric material on a deposition substrate. In addition, a header substrate may be bonded to the plurality of islands of thermoelectric material so that the plurality of islands are between the deposition substrate and the header substrate. More particularly, the plurality of islands of thermoelectric material may be a plurality of epitaxial islands of thermoelectric material, and crystal structures of the plurality of epitaxial islands of thermoelectric material may be aligned with a crystal structure of the deposition substrate.

The deposition substrate and the header substrate may be substrates of different materials. In addition, a plurality of solder bonds may be provided with a respective one of the plurality of solder bonds between each of the plurality of islands and the header substrate. The deposition substrate and the plurality of islands of thermoelectric material may be substrates of different materials. In addition, a plurality of conductive traces may be provided on a surface of the header substrate. More particularly, the plurality of islands of thermoelectric material may be bonded to the plurality of conductive traces so that the plurality of conductive traces are between the plurality of islands and the header substrate.

According to still other embodiments of the present invention, a method of forming a thermoelectric device may include forming a first plurality of conductive traces and bonding a first plurality of thermoelectric elements to the first plurality of conductive traces with the first plurality of thermoelectric elements having a first conductivity type. A second plurality of thermoelectric elements may be bonded to the first plurality of conductive traces with the second plurality of thermoelectric elements having a second conductivity type opposite the first conductivity type. A second plurality of conductive traces may be formed on the first and second pluralities of thermoelectric elements so that the first and second pluralities of thermoelectric elements are between the first and second pluralities of conductive traces. In addition, surfaces of the second plurality of conductive traces opposite the first and second pluralities of thermoelectric elements may be free of materials having a thickness greater than about 100 micrometers, and more particularly, greater than about 50 micrometers, spanning multiple ones of the second plurality of conductive traces.

Surfaces of the second plurality of conductive traces opposite the first and second pluralities of thermoelectric elements may be arranged within about 10 micrometers of a same plane, and more particularly, within about 5 micrometers of a same plane, and still more particularly, within about 2 micrometers or even within about 1 micrometer of a same plane. The first plurality of conductive traces may be formed on a header substrate so that the first plurality of conductive traces are between the header substrate and the first and second pluralities of thermoelectric elements.

Surfaces of the first plurality of conductive traces opposite the first and second pluralities of thermoelectric elements may be free of materials having a thickness greater than about 100 micrometers, and more particularly, greater than about 50 micrometers, spanning multiple ones of the first plurality of conductive traces. A support material may be provided between ones of the first plurality of conductive traces and/or between ones of the second plurality of conductive traces so that the support material provides mechanical coupling between the first plurality of conductive traces and/or between the second plurality of conductive traces wherein the support material is electrically insulating.

A support material may be provided between ones of the first and second pluralities of thermoelectric elements so that the support material provides mechanical coupling between the first and second pluralities of thermoelectric elements, and the support material may be electrically insulating. Moreover, surfaces of the second plurality of conductive traces opposite the first and second pluralities of thermoelectric elements may be exposed.

According to yet other embodiments of the present invention, a thermoelectric structure may include a first plurality of conductive traces, and a first plurality of thermoelectric elements bonded to the first plurality of conductive traces with the first plurality of thermoelectric elements having a first conductivity type. A second plurality of thermoelectric elements may be bonded to the first plurality of conductive traces with the second plurality of thermoelectric elements having a second conductivity type opposite the first conductivity type. In addition, a second plurality of conductive traces may be provided on the first and second pluralities of thermoelectric elements so that the first and second pluralities of thermoelectric elements are between the first and second pluralities of conductive traces. Moreover, surfaces of the second plurality of conductive traces opposite the first and second pluralities of thermoelectric elements may be free of materials having a thickness greater than about 100 micrometers, and more particularly, greater than about 50 micrometers, spanning multiple ones of the second plurality of conductive traces.

Surfaces of the second plurality of conductive traces opposite the first and second pluralities of thermoelectric elements may be arranged within about 10 micrometers of a same plane, and more particularly, within about 5 micrometers of a same plane, and still more particularly, within about 2 micrometers or even within about 1 micrometer of a same plane. In addition, the first plurality of conductive traces may be on a header substrate so that the first plurality of conductive traces are between the header substrate and the first and second pluralities of thermoelectric elements.

Surfaces of the first plurality of conductive traces opposite the first and second pluralities of thermoelectric elements may be free of materials having a thickness greater than about 100 micrometers, and more particularly, greater than about 50 micrometers, spanning multiple ones of the first plurality of conductive traces. In addition, a support material may be between ones of the first plurality of conductive traces and/or between ones of the second plurality of conductive traces so that the support material provides mechanical coupling between the first plurality of conductive traces and/or between the second plurality of conductive traces, and the support material is electrically insulating. In addition or in an alternative, a support material may be between ones of the first and second pluralities of thermoelectric elements so that the support material provides mechanical coupling between the first and second pluralities of thermoelectric elements, and the support material may be electrically insulating.

BRIEF DESCRIPTION OF THE DRAWINGS

FIGS. 4A-D are cross-sectional views illustrating operations of transferring p-type thermoelectric elements from a deposition substrate to conductive traces on a P-header substrate according to some embodiments of the present invention.

FIGS. 8A-D are cross-sectional views illustrating operations of transferring n-type thermoelectric elements from a deposition substrate to conductive traces on an N-header substrate according to some embodiments of the present invention.

DETAILED DESCRIPTION

Figure 1:
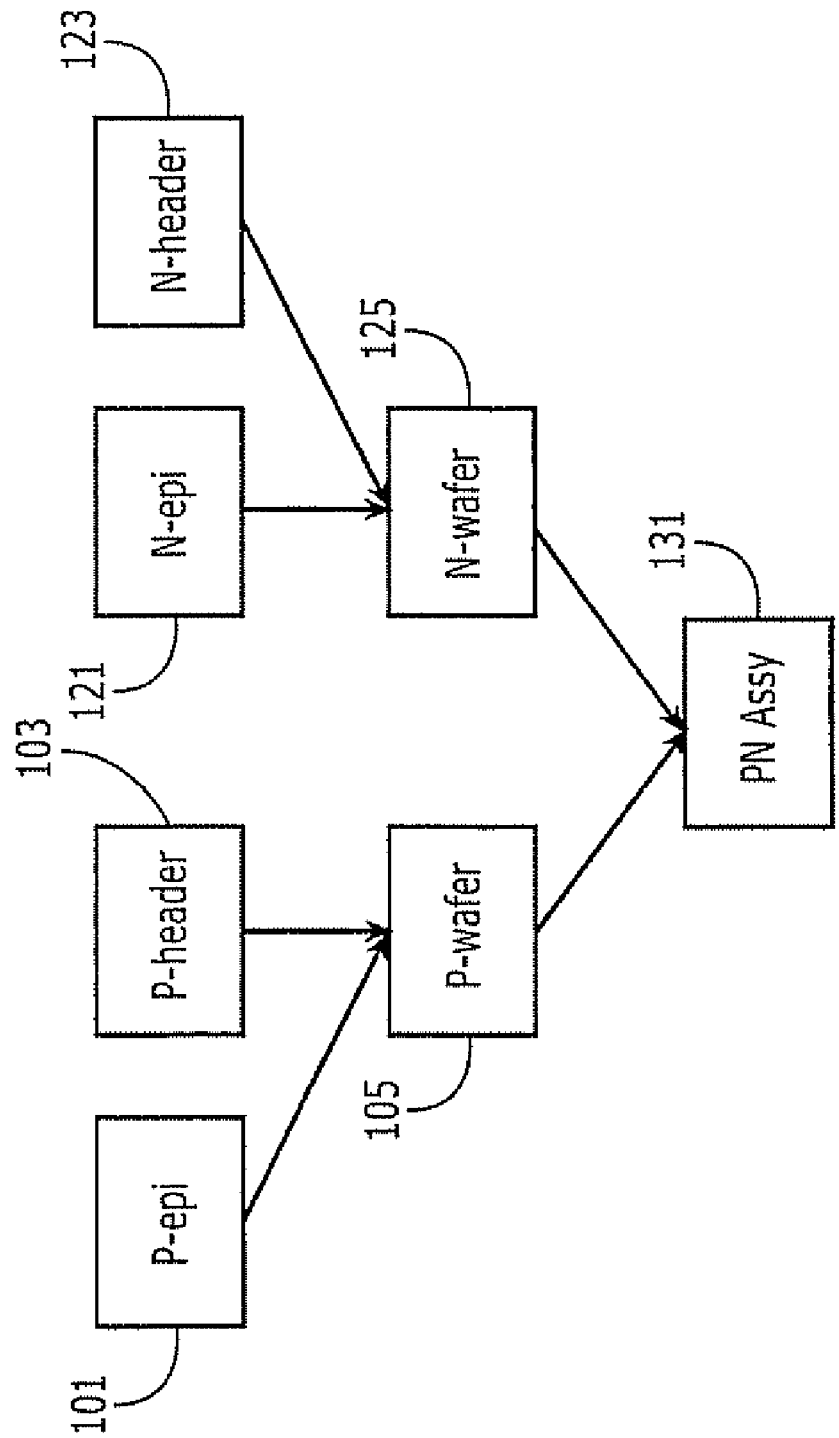
FIG. 1 is a block diagram illustrating operations of forming thermoelectric devices according to some embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

According to embodiments of the present invention shown in FIG. 1, a layer of an epitaxial p-type thermoelectric material may be grown on a deposition substrate (such as a gallium arsenide GaAs substrate) and then patterned to provide epitaxial islands of the p-type thermoelectric material on the deposition substrate as shown in block 101. At block 103, conductive traces (such as copper traces) may be formed on a P-header substrate (such as a substrate of copper, beryllium oxide, aluminum nitride, aluminum oxide, diamond, copper molybdenum, copper tungsten, silicon carbide, aluminum, etc.). The epitaxial islands of the p-type thermoelectric material may then be bonded (for example, using solder bonds) to the conductive traces on the P-header so that the epitaxial islands of the p-type thermoelectric material are between the deposition substrate and the P-header. The deposition substrate may then be selectively removed to provide a P-wafer at block 105 including the epitaxial islands of the p-type thermoelectric material on the P-header.

As used herein, the term "deposition substrate" refers to a substrate on which a layer is grown and/or deposited. If an epitaxial layer is grown on a deposition substrate, crystal structures of the epitaxial layer and the deposition substrate will be aligned. As used herein, the term "header substrate" (or "header") refers to a substrate to which previously formed thermoelectric elements are bonded, such as by soldering. The term "P-header substrate" (or "P-header") refers to a header substrate to which p-type thermoelectric elements are bonded (before bonding n-type thermoelectric elements). The term "N-header substrate" (or "N-header") refers to a header substrate to which n-type thermoelectric elements are bonded (before bonding p-type thermoelectric elements).

Similar operations may be used to form an N-wafer as discussed below with respect to blocks 121, 123, and 125. More particularly, a layer of an epitaxial n-type thermoelectric material may be grown on a deposition substrate (such as a gallium arsenide GaAs substrate) and then patterned to provide epitaxial islands of the n-type thermoelectric material on the deposition substrate as shown in block 121. At block 123, conductive traces (such as copper traces) may be formed on an N-header (such as a substrate of copper, beryllium oxide, aluminum nitride, aluminum oxide, diamond, copper molybdenum, copper tungsten, silicon carbide, aluminum, etc.). The epitaxial islands of the n-type thermoelectric material may then be bonded (for example, using solder bonds) to the conductive traces on the N-header so that the epitaxial islands of the n-type thermoelectric material are between the deposition substrate and the P-header. The deposition substrate may then be selectively removed to provide an N-wafer at block 125 including the epitaxial islands of the n-type thermoelectric material on the N-header.

At block 131, the P-wafer and the N-wafer may be joined to provide a PN-assembly with the epitaxial islands of p-type and n-type thermoelectric material between the P-header and the N-header. More particularly, the epitaxial islands of the p-type thermoelectric material on the P-wafer may be bonded (for example, using solder bonding) to the electrically conductive traces of the N-wafer, and the epitaxial islands of the n-type thermoelectric material on the N-wafer may be bonded (for example, using solder bonding) to the electrically conductive traces of the P-wafer. If the P-header and N-header comprise different materials, one of the P-header or the N-header may be selectively removed while maintaining both sets of the electrically conductive traces and the islands of p-type and n-type thermoelectric materials therebetween on the other of the P-header or N-header. According to other embodiments of the present invention, both of the P-header and the N-header may be removed. By removing one or both of the P-header and/or the N-header, thermal resistance between the islands of thermoelectric material and a surface being heated/cooled may be reduced, and/or thermal resistance between the islands of thermoelectric material and a heat source/sink may be reduced. Operations of forming thermoelectric devices and resulting structures are discussed in greater detail below.

Figure 2A:
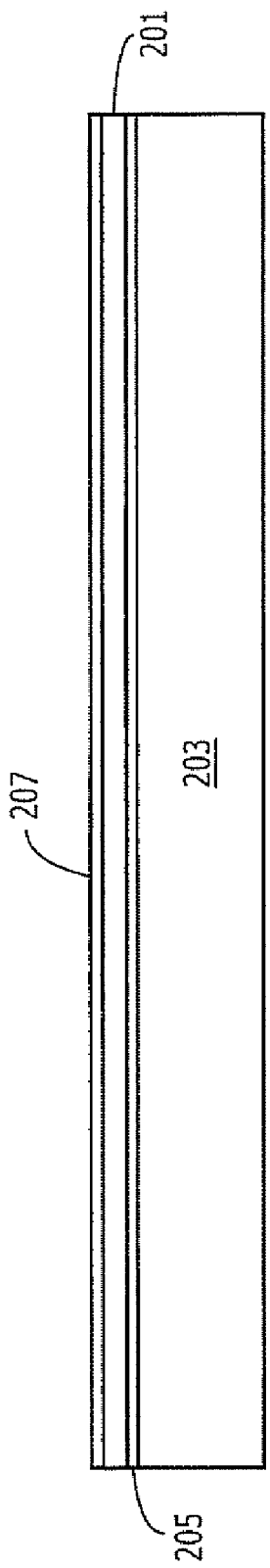
FIGS. 2A-B are cross-sectional views illustrating operations of forming epitaxial islands of p-type thermoelectric material on a deposition substrate according to embodiments of the present invention.
Figure 2B:
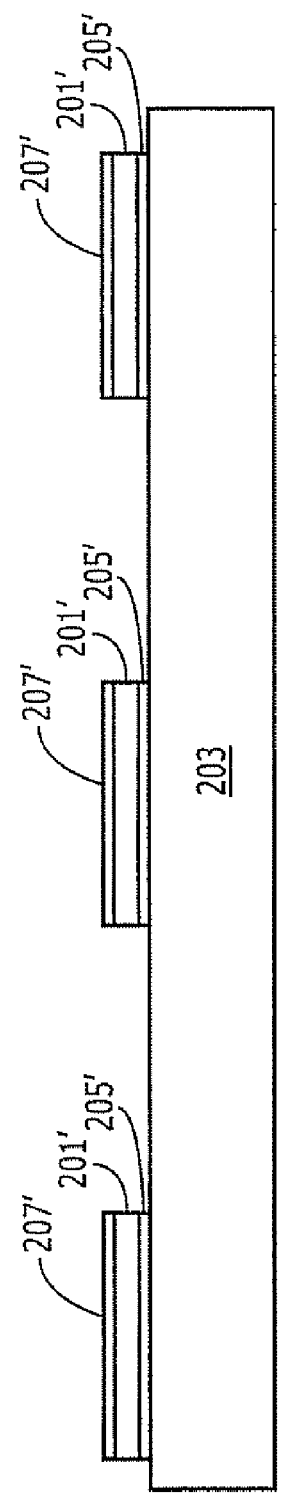
Figure 2C:
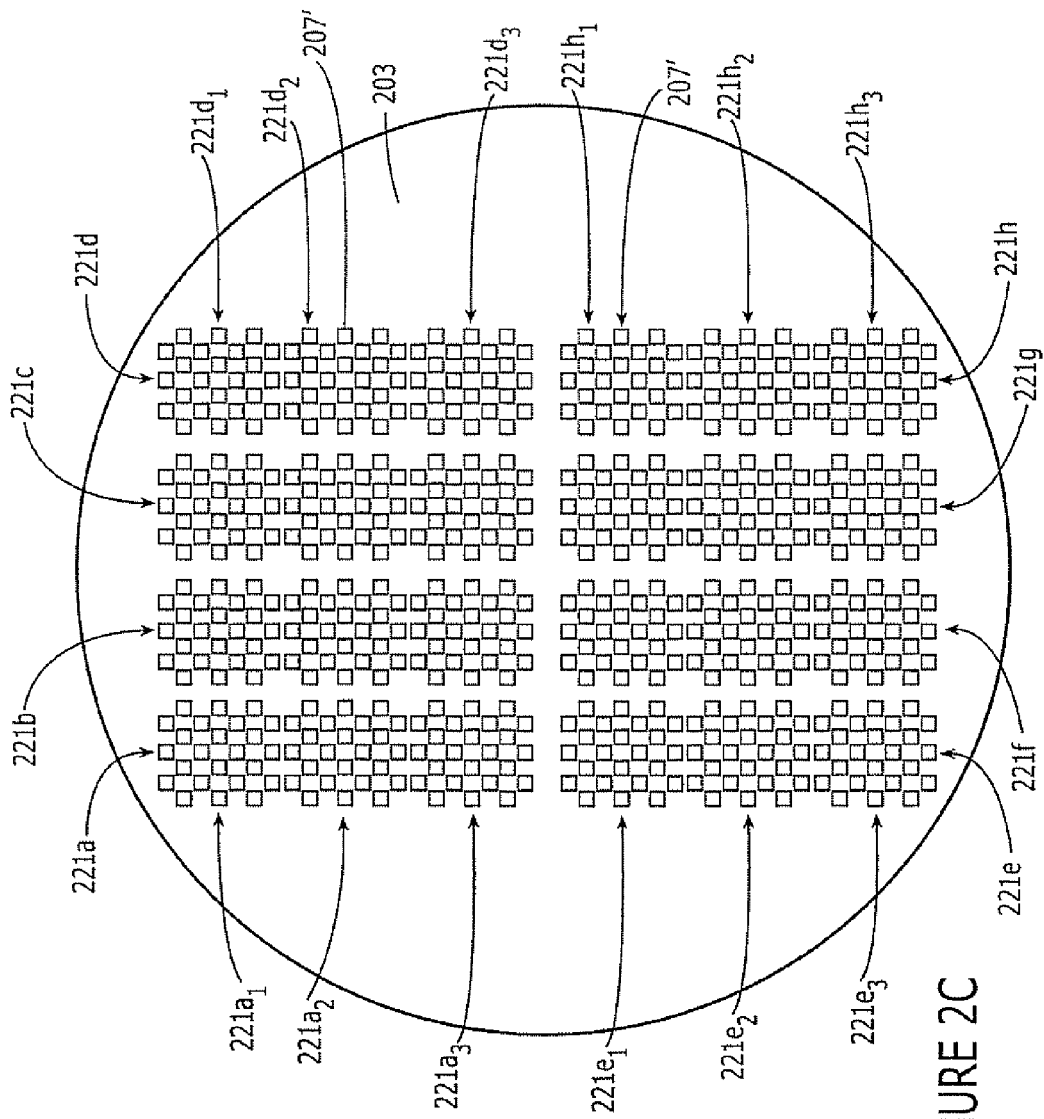
FIG. 2C is a plan view of a deposition substrate including modules and sub-modules of epitaxial islands of p-type thermoelectric material corresponding to the cross-sectional view of FIG. 2B according to some embodiments of the present invention.

P-type islands of thermoelectric material may be formed on deposition substrates as shown in FIGS. 2A-C. As shown in FIG. 2A, a continuous layer 201 of epitaxial p-type thermoelectric material may be formed on a deposition substrate 203 (also referred to as a growth substrate), such as a gallium arsenide (GaAs) substrate. By way of example, the continuous layer 201 of epitaxial p-type thermoelectric material may be a superlattice of $Bi_2Te_3/Sb_2Te_3$, and a buffer layer 205 may be provided between the deposition substrate 203 and the continuous layer 201. The buffer layer 205, for example, may include a layer of $Bi_2Te_3$ having a thickness of about 0.5 micrometers. By providing that the deposition substrate 203 has a single crystal structure by growing the continuous layer 201 as an epitaxial layer, a crystal structure of the continuous layer 201 may be aligned with a crystal structure of the deposition substrate 203. Superlattices of thermoelectric materials are discussed, for example, in U.S. Patent Publication Nos. 2003/0099279 and 2007/0028956, both to Venkatasubramanian et al., the disclosures of which are hereby incorporated herein in their entirety by reference.

The continuous layer 201 of epitaxial p-type thermoelectric material may have a thickness less than about 100 micrometers, and more particularly, less than about 50 micrometers, and still more particularly, less than about 20 micrometers. According to some embodiments of the present invention discussed herein, the continuous layer 201 of p-type thermoelectric material may be a substantially single crystal layer of p-type thermoelectric material epitaxially formed on a single crystal deposition substrate 203 so that crystal structures of the continuous layer 201 and the deposition substrate 203 are aligned. Accordingly, the islands of thermoelectric material and the thermoelectric elements formed from the continuous layer 201 may have substantially single crystal structures. According to other embodiments of the present invention, the continuous layer 201 of p-type thermoelectric material may have an amorphous and/or polycrystalline structure so that the islands of thermoelectric material and the thermoelectric elements formed from the continuous layer 201 have an amorphous and/or polycrystalline structure. The continuous layer 201 may thus be formed, for example, by chemical vapor deposition, sputtering, evaporation, etc.

As further shown in FIG. 2A, an ohmic contact layer 207 may be formed on the continuous layer 201 of epitaxial p-type thermoelectric material. The ohmic contact layer 207 may provide a wettable layer for a bonding solder, and/or the ohmic contact layer 207 may protect the epitaxial p-type thermoelectric material. The ohmic contact layer 207, for example, may include layers of chromium, titanium, nickel, and gold having respective thicknesses of about 50 Angstroms, about 4000 Angstroms, about 1500 Angstroms, and about 500 Angstroms. For example, the chromium layer may be provided between the titanium layer and the layer 201, the titanium layer may be provided between the chromium layer and the nickel layer, and the nickel layer may be provided between the gold layer and the titanium layer. Accordingly, the chromium, titanium, and nickel layers may be between the gold layer and the layer 201. The ohmic contact layer may also include a relatively thick copper layer (for example, having a thickness of about 5 micrometers) so that the chromium, titanium, nickel, and gold layers are between the copper layer and the continuous layer 201 of epitaxial p-type thermoelectric material.

As shown in FIG. 2B, the ohmic contact layer 207, the layer 201 of epitaxial p-type thermoelectric material, and the buffer layer 205 may be patterned to provide a plurality of epitaxial islands 201' (or mesas) of p-type thermoelectric material (also referred to as p-type thermoelectric elements) on the deposition substrate 203 together with patterned portions 207' and 205' of the ohmic contact layer 207 and the buffer layer 205. As shown, all layers of the ohmic contact layer 207, the layer 201 of epitaxial p-type thermoelectric material, and the buffer layer 205 may be patterned using a single photolithographic mask. Accordingly, solder used for a subsequent solder bond may wet to an entire upper surface of the patterned ohmic contact layer 207'. While the islands of p-type thermoelectric material may be epitaxial single crystal islands as discussed herein, the islands 201' of p-type thermoelectric material may be polycrystalline and/or amorphous according to other embodiments of the present invention.

According to other embodiments of the present invention, upper solder wettable layers of the ohmic contact layer 207 (such as gold and nickel layers) may be patterned using a first photolithographic mask, and then the lower solder non-wettable layers of the ohmic contact layer 207 (such as titanium and chromium layers) and the layer 201 of thermoelectric material and the buffer layer 205 may be patterned using a second photolithographic mask (larger than the first photolithographic mask). Accordingly, lower solder non-wettable layers of the patterned portions of the ohmic contact layer 207' may cover an entire surface of each epitaxial island 201' of p-type thermoelectric material, while edge portions of each epitaxial island 201' may be free of upper solder wettable layers (such as gold and nickel layers). Solder used for a subsequent solder bond may thus be confined to a central portion of each epitaxial island 201' having solder wettable layers thereon.

As shown in FIG. 2B, the epitaxial islands 201' may be free of solder until bonded to a header as discussed in greater detail below. Stated in other words, solder may be provided on the header and then bonded to the patterned ohmic contact layers 207' during a reflow operation. According to other embodiments of the present invention, solder may be provided on the patterned ohmic contact layers 207' before bonding to a header. For example, solder may be selectively plated on the continuous ohmic contact layer 207 of FIG. 2A through a plating mask (such as a photoresist plating mask) using the ohmic contact layer 207 as a plating electrode. The selectively plated solder may then be used as an etch mask to pattern the ohmic contact layer 207', the epitaxial islands 201', and/or the buffer layers 205' of FIG. 2B. The solder may thus extend across an entirety of the epitaxial islands 201'.

According to other embodiments of the present invention, the selectively plated solder may be used as an etch mask to pattern upper solder wettable layers (such as gold and nickel layers) of the ohmic contact layer 207, and a photoresist mask extending beyond edges of the solder may be used to pattern solder non-wettable layers (such as titanium and chromium layers) of the ohmic contact layer 207 and to pattern the epitaxial islands 201' and buffer layers 205'. Edge portions of the epitaxial islands 201' may thus be free of the solder.

As shown in FIG. 2A, the ohmic contact layer 207 may extend continuously across the layer 201 of epitaxial p-type thermoelectric material. Such a continuous ohmic contact layer 207, for example, may be formed by sputtering and/or evaporation. According to other embodiments of the present invention, patterned ohmic contact layers 207' may be selectively formed, for example, by sputtering and/or evaporating through a shadow mask. Such selectively formed ohmic contact layers may then be used to pattern the epitaxial islands 201' (also referred to as p-type thermoelectric elements) and buffer layers 205' without requiring another masking operation.

FIG. 2C is a plan view of a deposition substrate 203 including a plurality of epitaxial islands of p-type thermoelectric material with patterned ohmic contact layers 207' thereon as discussed above with respect to FIG. 2B. The epitaxial islands are not visible in the plan view of FIG. 2C, because each epitaxial island is covered by a respective patterned ohmic contact layer 207'. As shown in FIG. 2C, the epitaxial islands of p-type thermoelectric material may be grouped into modules 221a-h, and each module 221a-h may include three sub-modules ($221a_{1-3}$, $221b_{1-3}$, ... $221h_{1-3}$) with each sub-module including an arrangement of 24 epitaxial islands of p-type thermoelectric material for one thermoelectric device. More particularly, an arrangement of the epitaxial islands of p-type thermoelectric material in a sub-module may define an arrangement of the p-type thermoelectric elements in a subsequently formed thermoelectric device. Accordingly, separate handling of individual p-type thermoelectric elements may be reduced and/or avoided.

Figure 3A:
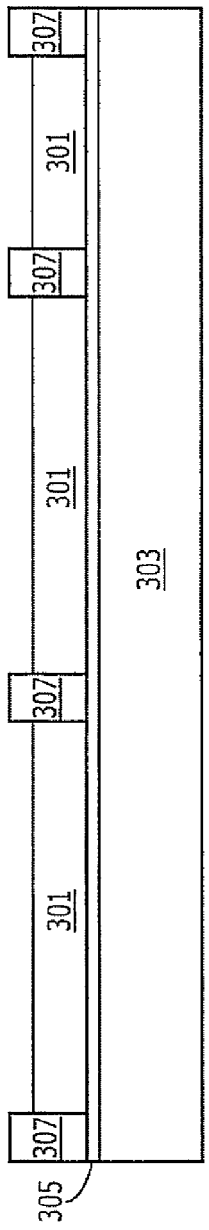
FIGS. 3A-C are cross-sectional views illustrating operations of forming conductive traces on a P-header substrate according to embodiments of the present invention.

As shown in FIG. 3A, a P-header may include a plurality of conductive traces 301 on a substrate 303 such as an aluminum nitride (AlN) substrate having a thickness of about 20 mils. While aluminum nitride is discussed by way of example, other substrate materials such as beryllium oxide, copper, aluminum oxide, diamond, copper molybdenum, copper tungsten, silicon carbide, silicon, and/or aluminum may be used. If a conductive material is used for the substrate 303, a dielectric layer may be provided between the substrate 303 and the conductive traces 301.

The P-header may be formed by providing a continuous seed layer 305 of the substrate 303, as shown in FIG. 3A. The seed layer 305, for example, may include a first titanium layer having a thickness of about 300 Angstroms on the substrate 303, a gold layer having a thickness of about 5000 Angstroms on the first titanium layer, and a second titanium layer having a thickness of about 300 Angstroms on the gold layer, so that the gold layer is between the first and second titanium layers. A plating mask 307 may be formed on the seed layer 305, and portions of the seed layer 305 exposed through the plating mask 307 may define portions of the seed layer 305 on which the conductive traces 301 are plated.

The conductive traces 301 may be formed by plating a first layer of nickel having a thickness in the range of about 0.5 micrometers to about 1 micrometer on the seed layer 305; by plating a layer of copper having a thickness in the range of about 10 micrometers to about 15 micrometers on the nickel layer; by plating a second layer of nickel having a thickness in the range of about 0.5 micrometers to about 1 micrometer on the copper layer; and by plating a flash layer of gold on the second layer of nickel. Accordingly, the copper layer may be between the first and second nickel layers, and both nickel layers and the copper layer may be between the flash layer of gold and the seed layer 305.

Figure 3B:
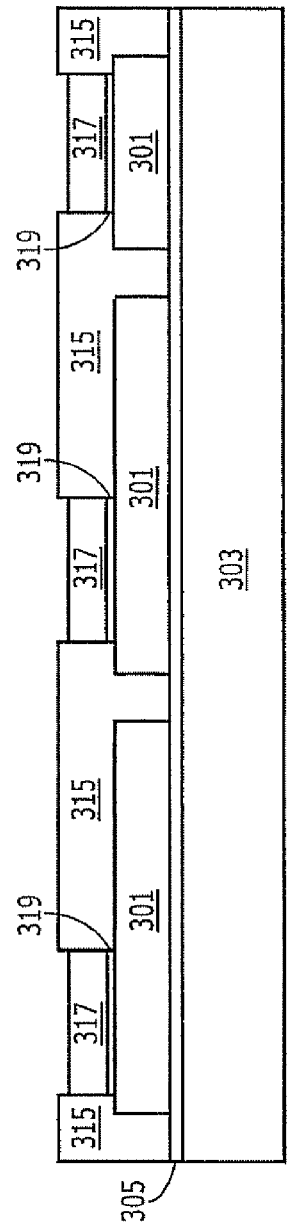

After plating the conductive traces 301, the plating mask 307 may be removed, and a second plating mask 315 may be formed as shown in FIG. 3B. The plating mask 315 may expose portions of the conductive traces 301 on which solder is to be plated. Before plating solder, barrier layers 319 (such as layers of nickel having a thickness in the range of about 0.5 micrometers to about 1 micrometer) may be plated on portions of the conductive traces 301 exposed through the plating mask 315. After plating the barrier layers 319, solder layers 317 may be plated on the barrier layers 319. The solder layers 317, for example, may be layers of tin solder having a thickness in the range of about 8 micrometers to about 9 micrometers. While tin solder is discussed by way of example, other solders such as tin silver solder, lead tin solder, indium solder, and/or other single and/or multiple element solders may be used.

Figure 3C:
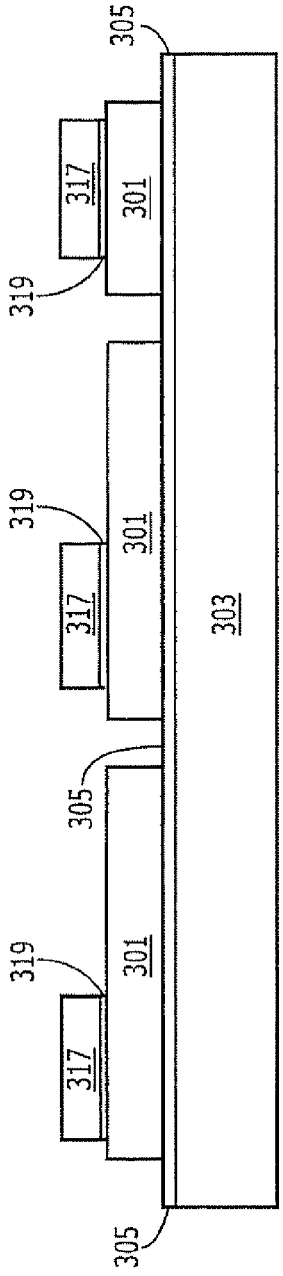

After plating the barrier layers 319 and the solder layers 317, the mask layer 315 may be removed, as shown in FIG. 3C. If the substrate 303 includes a conductive material, a dielectric layer may be provided at a surface of the substrate 303 to provide electrical isolation between the electrically conductive traces 301.

Figure 3D:
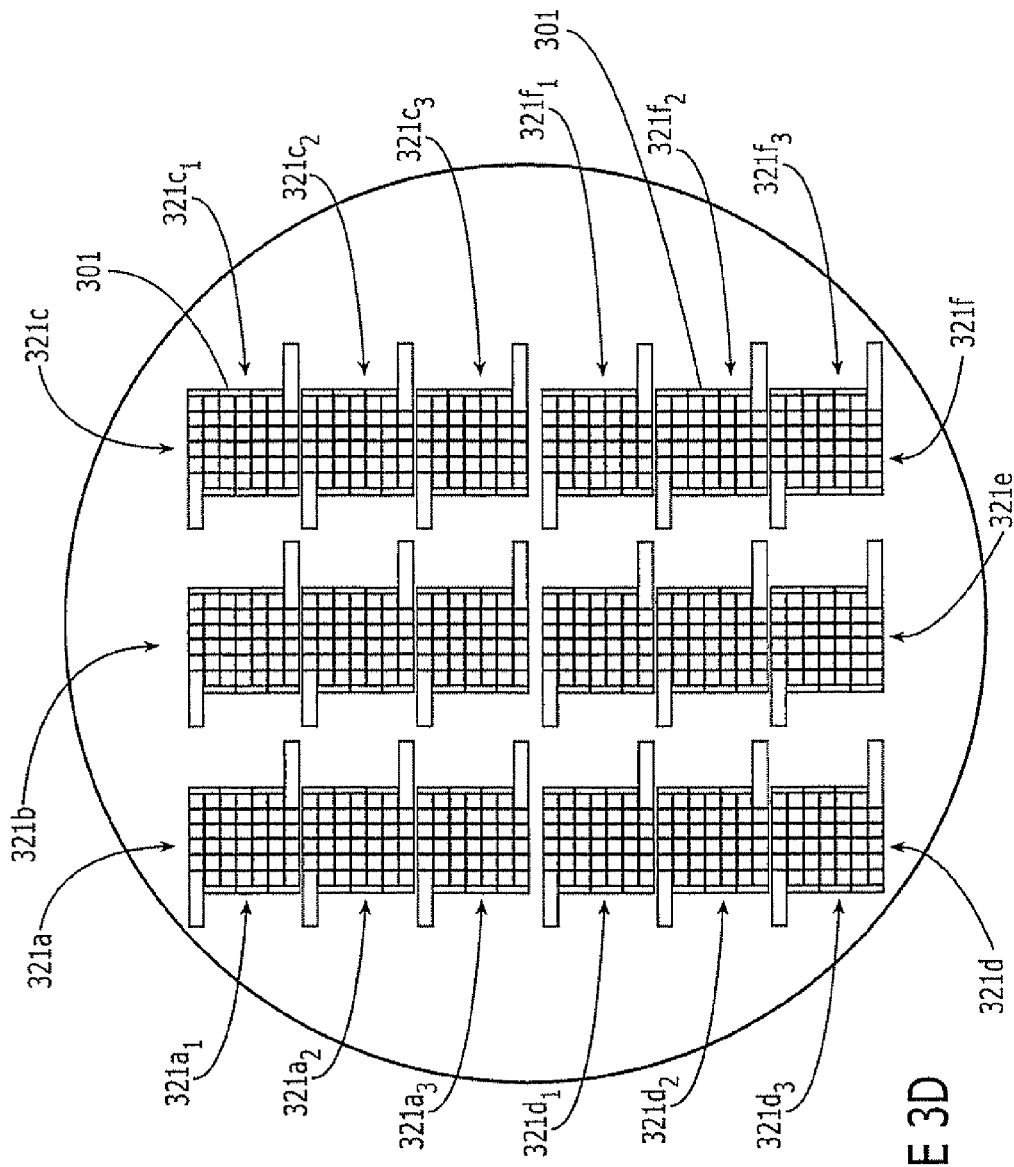
FIG. 3D is a plan view of a P-header substrate including conductive traces corresponding to the cross-sectional view of FIG. 3C according to some embodiments of the present invention.

FIG. 3D is a plan view of a P-header including substrate 303 and conductive traces 301 thereon as discussed above with respect to FIG. 3C. Due to the scale of FIG. 3D, the solder layers 317 are not separately shown in FIG. 3D. The pattern of conductive traces 301 of FIG. 3D corresponds to the pattern of epitaxial islands of FIG. 2C. As shown in FIG. 3D, the conductive traces 301 may be grouped into modules 321a-f, and each module 321a-f may include three sub-modules ($321a_{1-3}$, $321b_{1-3}$, ... $321f_{1-3}$) with each sub-module including an arrangement of conductive traces 301 for one thermoelectric device. More particularly, an arrangement of the conductive traces 301 in a sub-module may define an arrangement of the conductive traces in a subsequently formed thermoelectric device.

The epitaxial islands 201' of p-type thermoelectric material (also referred to as p-type thermoelectric elements) on the deposition substrate 203 of FIG. 2B may then be bonded to the conductive traces 301 of FIG. 3C using solder layers 317 as shown in FIG. 4A. More particularly, the solder layers 317 may be brought into contact with the solder wettable portions of ohmic contact layers 207' and subjected to a reflow operation. As discussed above, the solder layers 317 may be formed on the conductive traces 301 and then bonded to the ohmic contact layers 207'. According to other embodiments of the present invention, the solder layers 317 may be formed on the ohmic contact layers 207' and then bonded to the conductive traces 301.

As shown in FIG. 4A, edge portions of the ohmic contact layers 207' may remain free of the solder layers 317 after the bonding operation. For example, edge portions of the ohmic contact layer 207' may have solder wettable layers (such as layers of gold and/or nickel) removed therefrom so that solder non-wettable layers (such as layers of chromium and/or titanium) are exposed. Accordingly, the solder layers 317 may wet to central portions of the ohmic contact layer 207' where solder wettable layers are maintained without wetting to edge portions of the ohmic contact layer 207' where solder non-wettable layers have been removed. According to other embodiments of the present invention, solder wettable layers may extend across an entirety of the ohmic contact layers 207' so that solder layers 317 wet to entire surfaces of respective ohmic contact layers 207'.

Figure 5A:
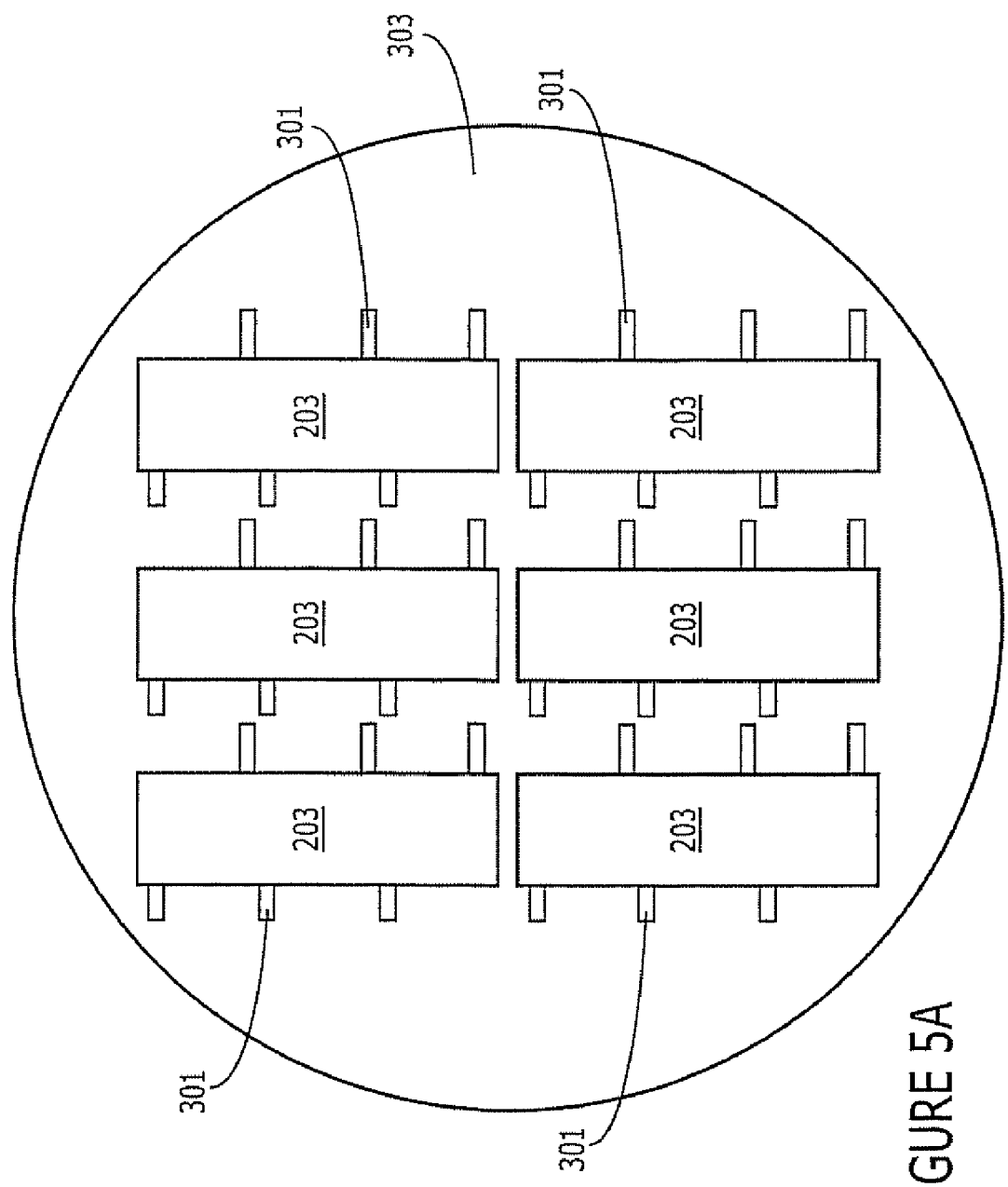
FIG. 5A is a plan view of a P-header substrate including deposition substrates bonded thereto corresponding to the cross-sectional view of FIG. 4A according to some embodiments of the present invention.

FIG. 5A is a plan view of a plurality of deposition substrates 203 bonded to a single P-header substrate 303, corresponding to the cross-sectional view of FIG. 4A. As shown in FIG. 5A, each deposition substrate 203 may include epitaxial islands of p-type thermoelectric material for three thermoelectric devices diced, for example, from the deposition substrate 203 of FIG. 2C. By dicing modules from a larger deposition substrate, before bonding to the P-header substrate 303, thermal stress/strain resulting from different coefficients of thermal expansion of the P-header substrate 303 and the deposition substrate(s) 203 may be reduced. According to other embodiments of the present invention, the deposition substrate 203 of FIG. 2C may be diced so that each sub-module of epitaxial islands for a single thermoelectric device are separate so that 18 different deposition substrates 203 are bonded to the P-header substrate 303 of FIG. 5A to further reduce stress/strain due to different coefficients of thermal expansion. According to still other embodiments of the present invention, a single deposition substrate including epitaxial islands for all conductive traces on the P-header may be bonded to the P-header substrate 303 to reduce handling of separate deposition substrates.

The deposition substrate 203 may then be selectively removed while maintaining the P-header substrate 303 as shown in FIG. 4B. If the deposition substrate 203 is a gallium arsenide substrate, for example, the deposition substrate 203 may be selectively removed using a mixture of $NH_4OH$, $H_2O_2$, and water.

As shown in FIG. 4C, the buffer layers 205' may be removed from the p-type thermoelectric elements 201', and contact metal layers 415 may be formed on exposed portions of the p-type thermoelectric elements 201'. The contact metal layer 415, for example, may include a layer of chromium having a thickness of about 50 Angstroms and a layer of gold having a thickness of about 500 Angstroms, with the layer of chromium between the layer of gold and the p-type thermoelectric elements 201'. Moreover, the contact metal layer may be formed using evaporation and/or sputtering. While not shown in FIG. 4C, contact metal may also be formed on exposed portions of substrate 303, seed layer 305, and/or traces 301.

A plating mask 417 may be formed on the contact metal layers 415 with portions of the contact metal layers 415 on the p-type thermoelectric elements 201' exposed through the plating mask 417. Layers of copper 419 and layers of solder 421 may be plated on the exposed portions of the contact metal layers 415, for example, using the seed layer 305 as a plating electrode so that plating current passes through thermoelectric elements 201'. Each of the layer of copper 419 and the layer of solder 421 may have a thickness in the range of about 4 micrometers to about 12 micrometers. Moreover, the layer of solder 421 may include tin solder, tin silver solder, lead tin solder, indium solder, and/or other single and/or multiple element solders.

The plating mask 417 may be removed as shown in FIG. 4D. As shown in FIG. 4D, portions of the p-type thermoelectric elements 201' may extend beyond the copper layers 419, and/or the solder layers 421. According to other embodiments of the present invention, the copper layers 419, and/or the solder layers 421 may extend substantially to edges of the respective p-type thermoelectric elements 201'. As further shown in FIG. 4D, portions of the seed layer 305 not covered by traces 301 may be removed to electrically isolate traces 301.

Figure 5B:
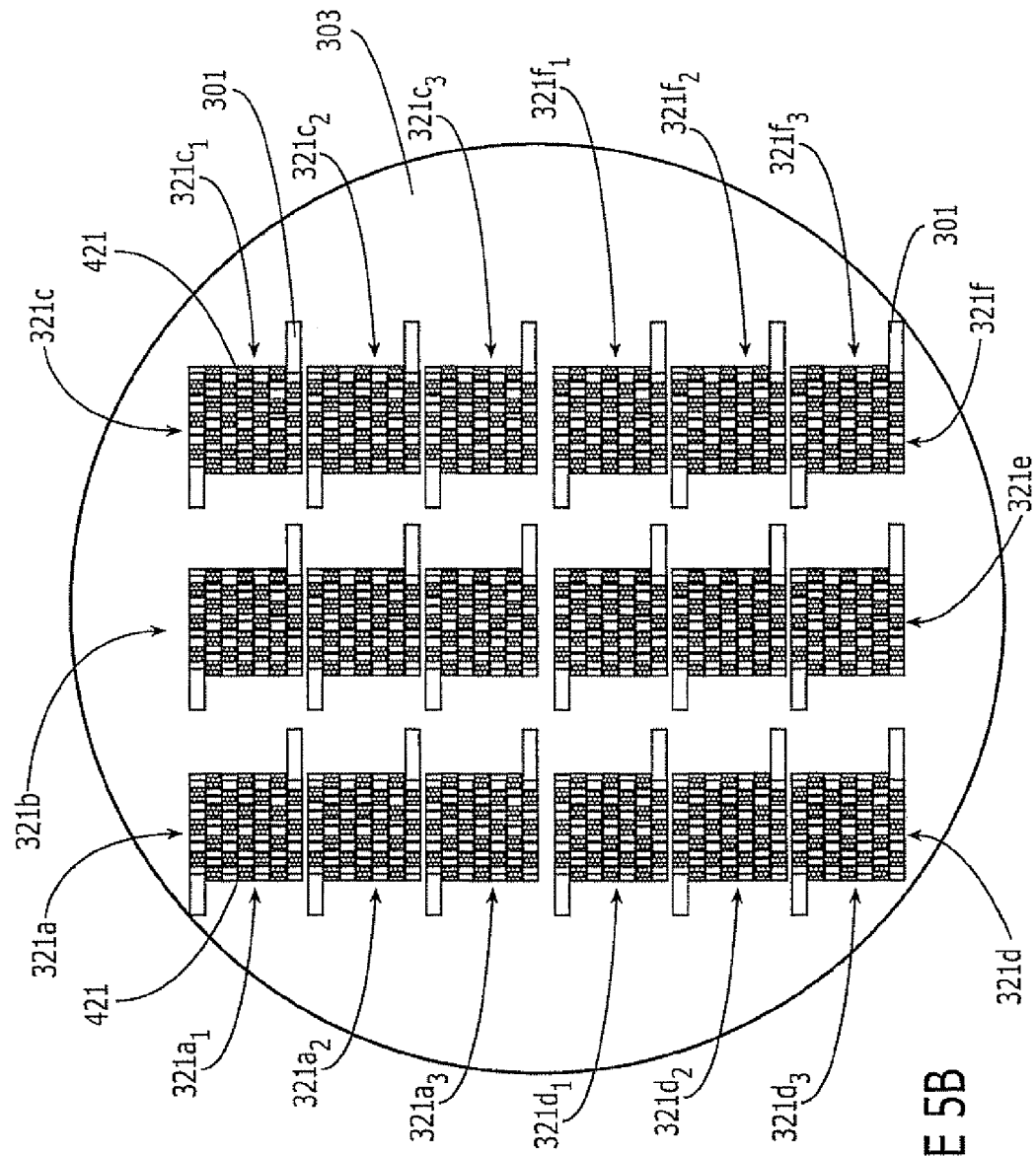
FIG. 5B is a plan view of a header substrate including p-type thermoelectric elements bonded thereto corresponding to the cross-sectional view of FIG. 4D according to some embodiments of the present invention.

FIG. 5B is a plan view of a P-header including substrate 303 and conductive traces 301 thereon as discussed above with respect to FIG. 3D with the addition of p-type thermoelectric elements and solder layers 421 as discussed above with respect to FIG. 4D. Due to the scale of FIG. 5B, the p-type thermoelectric elements 201' are not separately shown in FIG. 5B. As shown in FIG. 5B, the conductive traces 301 and respective p-type thermoelectric elements and solder layers 421 may be grouped into modules $321a$-$f$, and each module $321a$-$f$ may include three sub-modules ($321a_{1-3}$, $321b_{1-3}$, ... $321f_{1-3}$) with each sub-module including an arrangement of conductive traces 301 and p-type thermoelectric elements for one thermoelectric device. More particularly, an arrangement of the conductive traces 301 and p-type thermoelectric elements in a sub-module may define an arrangement of the conductive traces and p-type thermoelectric elements in a subsequently formed thermoelectric device.

As discussed above with respect to FIGS. 4A-D and 5A-B, solder may be provided on p-type thermoelectric elements 201' for subsequent bonding to conductive traces on an N-header substrate. According to other embodiments of the present invention, solder may instead be provided on conductive traces of an N-header so that solder layers 421 may be omitted from the p-type thermoelectric elements 201' of FIGS. 4D and 5B. If the solder layers 421 are omitted from FIGS. 4D and 5B, contact metal layers 415' and/or copper layers 419 may provide solder wettable surfaces for subsequent solder bonding.

An N-header including n-type thermoelectric elements may be formed using operations similar to those discussed above with respect to FIGS. 2A-C, 3A-D, 4A-D, and 5A-B. Operations of forming an N-header are discussed in greater detail below.

Figure 6A:
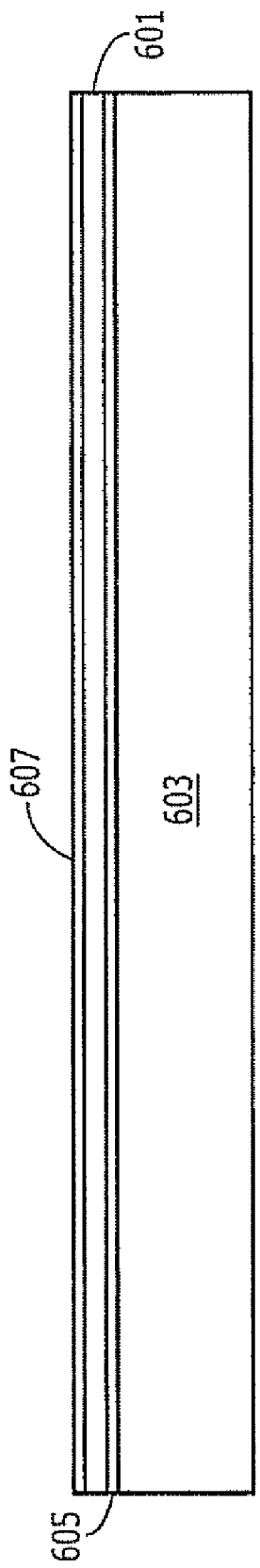
FIGS. 6A-B are cross-sectional views illustrating operations of forming epitaxial islands of n-type thermoelectric material on a deposition substrate according to embodiments of the present invention.
Figure 6B:
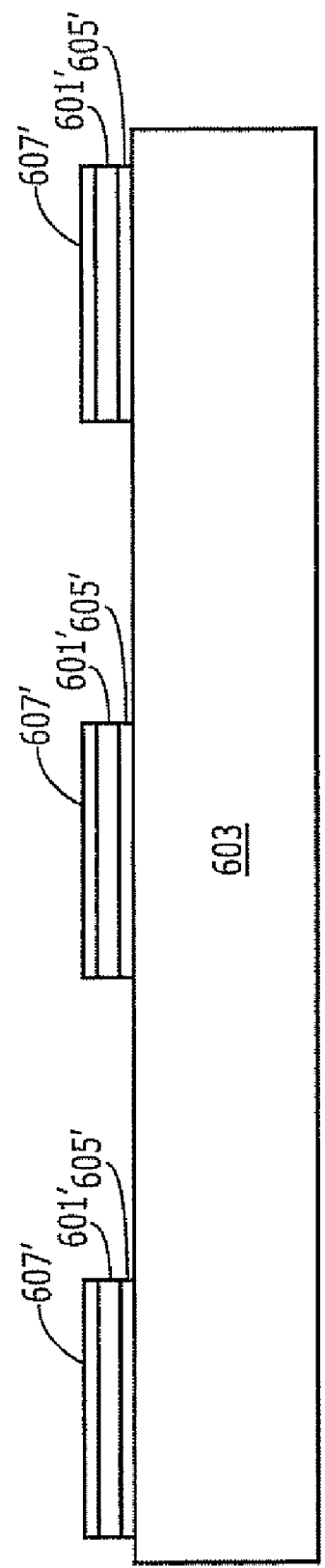
Figure 6C:
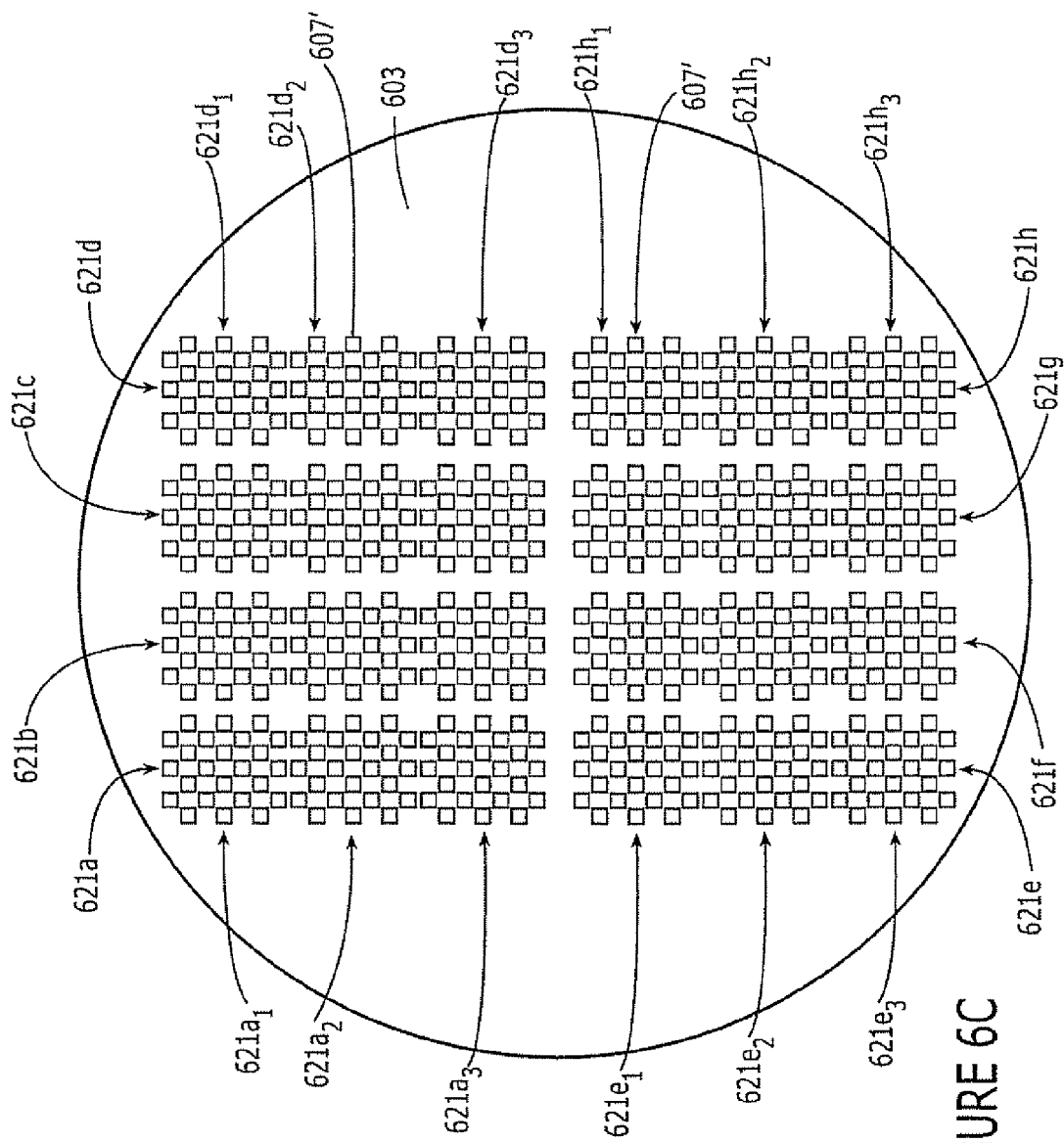
FIG. 6C is a plan view of a deposition substrate including modules and sub-modules of epitaxial islands of n-type thermoelectric material corresponding to the cross-sectional view of FIG. 6B according to some embodiments of the present invention.

N-type islands of thermoelectric material may be formed on deposition substrates as shown in FIGS. 6A-C. As shown in FIG. 6A, a continuous layer 601 of epitaxial n-type thermoelectric material may be formed on a deposition substrate 603 (also referred to as a growth substrate), such as a gallium arsenide (GaAs) substrate. By way of example, the continuous layer 601 of epitaxial n-type thermoelectric material may be a superlattice of $Bi_2Te_3/Bi_2Te_{3-x}Se_x$ ($0<x<1$) and a buffer layer 605 may be provided between the deposition substrate 603 and the continuous layer 601. The buffer layer 605, for example, may include a layer of $Bi_2Te_3$ having a thickness of about 0.5 micrometers. By providing that the deposition substrate 603 has a single crystal structure by growing the continuous layer 601 as an epitaxial layer, a crystal structure of the continuous layer 601 may be aligned with a crystal structure of the deposition substrate 603. Superlattices of thermoelectric materials are discussed, for example, in U.S. Patent Publication Nos. 2003/0099279 and 2007/0028956, both to Venkatasubramanian et al., the disclosures of which are hereby incorporated herein in their entirety by reference.

More particularly, the continuous layer 601 of epitaxial n-type thermoelectric material may have a thickness less than about 100 micrometers, and more particularly, less than about 50 micrometers, and still more particularly, less than about 20 micrometers. According to some embodiments of the present invention discussed herein, the continuous layer 601 of n-type thermoelectric material may be a substantially single crystal layer of n-type thermoelectric material epitaxially formed on a single crystal deposition substrate 603 so that crystal structures of the continuous layer 601 and the deposition substrate 603 are aligned. Accordingly, the islands of thermoelectric material and the thermoelectric elements formed from the continuous layer 601 may have substantially single crystal structures. According to other embodiments of the present invention, the continuous layer 601 of n-type thermoelectric material may have an amorphous and/or polycrystalline structure so that the islands of thermoelectric material and the thermoelectric elements formed from the continuous layer 601 have an amorphous and/or polycrystalline structure. The continuous layer 601 may thus be formed, for example, by chemical vapor deposition, sputtering, evaporation, etc.

As further shown in FIG. 6A, an ohmic contact layer 607 may be formed on the continuous layer 601 of epitaxial n-type thermoelectric material. The ohmic contact layer 607 may provide a wettable layer for a bonding solder, and/or the ohmic contact layer 607 may protect the epitaxial n-type thermoelectric material. The ohmic contact layer 607, for example, may include layers of chromium, titanium, nickel, and gold having respective thicknesses of about 50 Angstroms, about 4000 Angstroms, about 1500 Angstroms, and about 500 Angstroms. For example, the chromium layer may be provided between the titanium layer and the layer 601, the titanium layer may be provided between the chromium layer and the nickel layer, and the nickel layer may be provided between the gold layer and the titanium layer. Accordingly, the chromium, titanium, and nickel layers may be between the gold layer and the layer 601. The ohmic contact layer may also include a relatively thick copper layer (for example, having a thickness of about 5 micrometers) so that the chromium, titanium, nickel, and gold layers are between the copper layer and the continuous layer 601 of epitaxial n-type thermoelectric material.

As shown in FIG. 6B, the ohmic contact layer 607, the layer 601 of epitaxial n-type thermoelectric material, and the buffer layer 605 may be patterned to provide a plurality of epitaxial islands 601' (or mesas) of n-type thermoelectric material (also referred to as n-type thermoelectric elements) on the deposition substrate 603 together with patterned portions 607' and 605' of the ohmic contact layer 607 and the buffer layer 605. As shown, all layers of the ohmic contact layer 607, the layer 601 of epitaxial n-type thermoelectric material, and the buffer layer 605 may be patterned using a single photolithographic mask. Accordingly, solder used for a subsequent solder bond may wet to an entire upper surface of the patterned ohmic contact layer 607'. While the islands of n-type thermoelectric material may be epitaxial single crystal islands as discussed herein, the islands 601' of n-type thermoelectric material may be polycrystalline and/or amorphous according to other embodiments of the present invention.

According to other embodiments of the present invention, upper solder wettable layers of the ohmic contact layer 607 (such as gold and nickel layers) may be patterned using a first photolithographic mask, and then the lower solder non-wettable layers of the ohmic contact layer 607 (such as titanium and chromium layers) and the layer 601 of thermoelectric material and the buffer layer 605 may be patterned using a second photolithographic mask (larger than the first photolithographic mask). Accordingly, lower solder non-wettable layers of the patterned portions of the ohmic contact layer 607' may cover an entire surface of each epitaxial island 601' of n-type thermoelectric material, while edge portions of each epitaxial island 601' may be free of upper solder wettable layers (such as gold and nickel layers). Solder used for a subsequent solder bond may thus be confined to a central portion of each epitaxial island 601' having solder wettable layers thereon.

As shown in FIG. 6B, the epitaxial islands 601' may be free of solder until bonded to a header as discussed in greater detail below. Stated in other words, solder may be provided on the header and then bonded to the patterned ohmic contact layers 607' during a reflow operation. According to other embodiments of the present invention, solder may be provided on the patterned ohmic contact layers 607' before bonding to a header. For example, solder may be selectively plated on the continuous ohmic contact layer 607 of FIG. 6A through a plating mask (such as a photoresist plating mask) using the ohmic contact layer 607 as a plating electrode. The selectively plated solder may then be used as an etch mask to pattern the ohmic contact layer 607', the epitaxial islands 601', and/or the buffer layers 605' of FIG. 6B. The solder may thus extend across an entirety of the epitaxial islands 601'.

According to other embodiments of the present invention, the selectively plated solder may be used as an etch mask to pattern upper solder wettable layers (such as gold and nickel layers) of the ohmic contact layer 607, and a photoresist mask extending beyond edges of the solder may be used to pattern solder non-wettable layers (such as titanium and chromium layers) of the ohmic contact layer 607 and to pattern the epitaxial islands 601' and buffer layers 605'. Edge portions of the epitaxial islands 601' may thus be free of the solder.

As shown in FIG. 6A, the ohmic contact layer 607 may extend continuously across the layer 601 of epitaxial p-type thermoelectric material. Such a continuous ohmic contact layer 607, for example, may be formed by sputtering and/or evaporation. According to other embodiments of the present invention, patterned ohmic contact layers 607' may be selectively formed, for example, by sputtering and/or evaporating through a shadow mask. Such selectively formed ohmic contact layers may then be used to pattern the epitaxial islands 601' (also referred to as p-type thermoelectric elements) and buffer layers 605' without requiring another masking operation.

FIG. 6C is a plan view of a deposition substrate 603 including a plurality of epitaxial islands of n-type thermoelectric material with patterned ohmic contact layers 607' thereon as discussed above with respect to FIG. 6B. The epitaxial islands are not visible in the plan view of FIG. 6C, because each epitaxial island is covered by a respective patterned ohmic contact layer 607'. As shown in FIG. 6C, the epitaxial islands of n-type thermoelectric material may be grouped into modules 621$a$-$h$, and each module 621$a$-$h$ may include three sub-modules (621$a_{1-3}$, 621$b_{1-3}$, ... 621$h_{1-3}$) with each sub-module including an arrangement of 24 epitaxial islands of n-type thermoelectric material for one thermoelectric device. More particularly, an arrangement of the epitaxial islands of n-type thermoelectric material in a sub-module may define an arrangement of the n-type thermoelectric elements in a subsequently formed thermoelectric device. Accordingly, separate handling of individual n-type thermoelectric elements may be reduced and/or avoided.

Figure 7A:
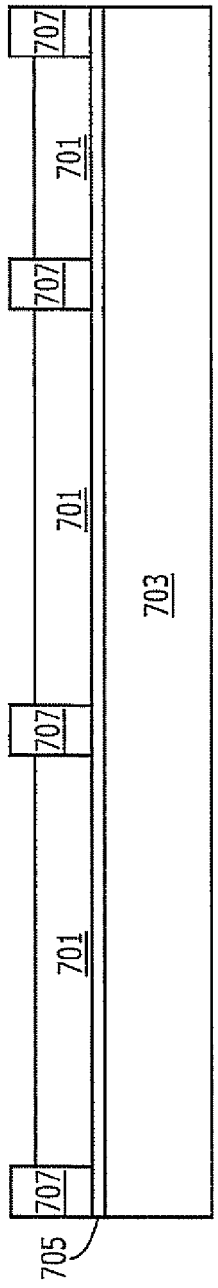
FIGS. 7A-C are cross-sectional views illustrating operations of forming conductive traces on an N-header substrate according to embodiments of the present invention.

As shown in FIG. 7A, an N-header may include a plurality of conductive traces 701 on a substrate 703 such as a silicon (Si) substrate. While silicon is discussed by way of example, other substrate materials such as beryllium oxide, copper, aluminum oxide, aluminum nitride, diamond, copper molybdenum, copper tungsten, silicon carbide, and/or aluminum may be used. If a conductive material is used for the substrate 703, a dielectric layer may be provided between the substrate 703 and the conductive traces 701. By using different materials for the N-header substrate 703 and the P-header substrate 303, one or the other of the N-header substrate 703 and the P-header substrate 303 may be removed after bonding the two together.

The N-header may be formed by providing a continuous seed layer 705 on the substrate 703, as shown in FIG. 7A. The seed layer 705, for example, may include a first titanium layer having a thickness of about 300 Angstroms on the substrate 703, a gold layer having a thickness of about 5000 Angstroms on the first titanium layer, and a second titanium layer having a thickness of about 300 Angstroms on the gold layer, so that the gold layer is between the first and second titanium layers. A plating mask 707 may be formed on the seed layer 705, and portions of the seed layer 705 exposed through the plating mask 707 may define portions of the seed layer 705 on which the conductive traces 701 are plated.

The conductive traces 701 may be formed by plating a first layer of nickel having a thickness in the range of about 0.5 micrometers to about 1 micrometer on the seed layer 705; by plating a layer of copper having a thickness in the range of about 10 micrometers to about 15 micrometers on the first layer of nickel; by plating a second layer of nickel having a thickness in the range of about 0.5 micrometers to about 1 micrometer on the copper layer; and by plating a flash layer of gold on the second layer of nickel. Accordingly, the copper layer may be between the first and second nickel layers, and both nickel layers and the copper layer may be between the flash layer of gold and the seed layer 705.

Figure 7B:
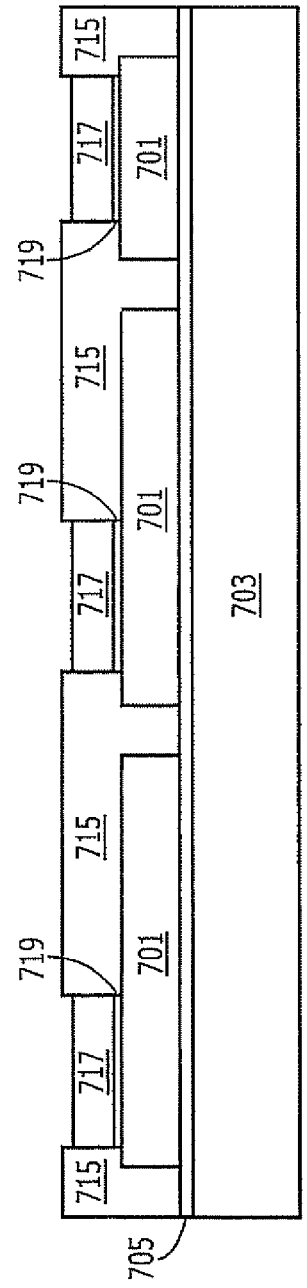

After plating the conductive traces 701, the plating mask 707 may be removed, and a second plating mask 715 may be formed as shown in FIG. 7B. The plating mask 715 may expose portions of the conductive traces 701 on which solder is to be plated. Before plating solder, barrier layers 719 (such as layers of nickel having a thickness in the range of about 0.5 micrometers to about 1 micrometer) may be plated on portions of the conductive traces 701 exposed through the plating mask 715. After plating the barrier layers 719, solder layers 717 may be plated on the barrier layers 719. The solder layers 717, for example, may be layers of tin solder having a thickness in the range of about 8 micrometers to about 9 micrometers. While tin solder is discussed by way of example, other solders such as tin silver solder, lead tin solder, indium solder, and/or other single and/or multiple element solders may be used.

Figure 7C:
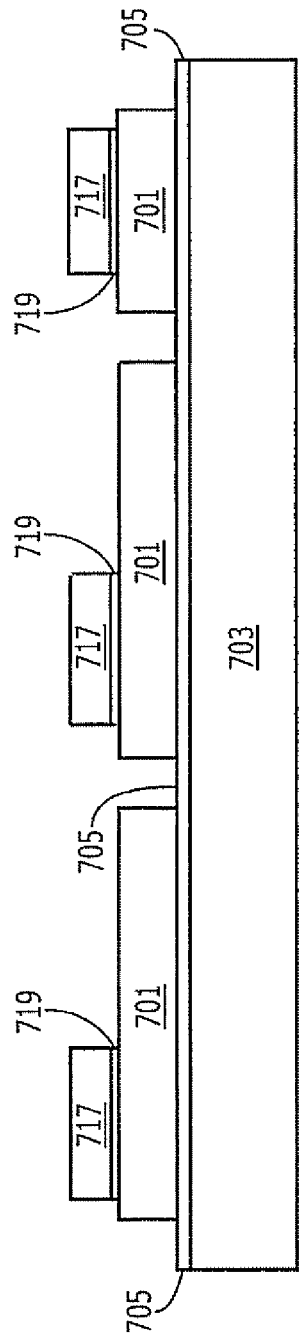

After plating the barrier layers 719 and the solder layers 717, the mask layer 715 may be removed, as shown in FIG. 7C. If the substrate 703 includes a conductive material, a dielectric layer may be provided at a surface of the substrate 703 to provide electrical isolation between the electrically conductive traces 701.

Figure 7D:
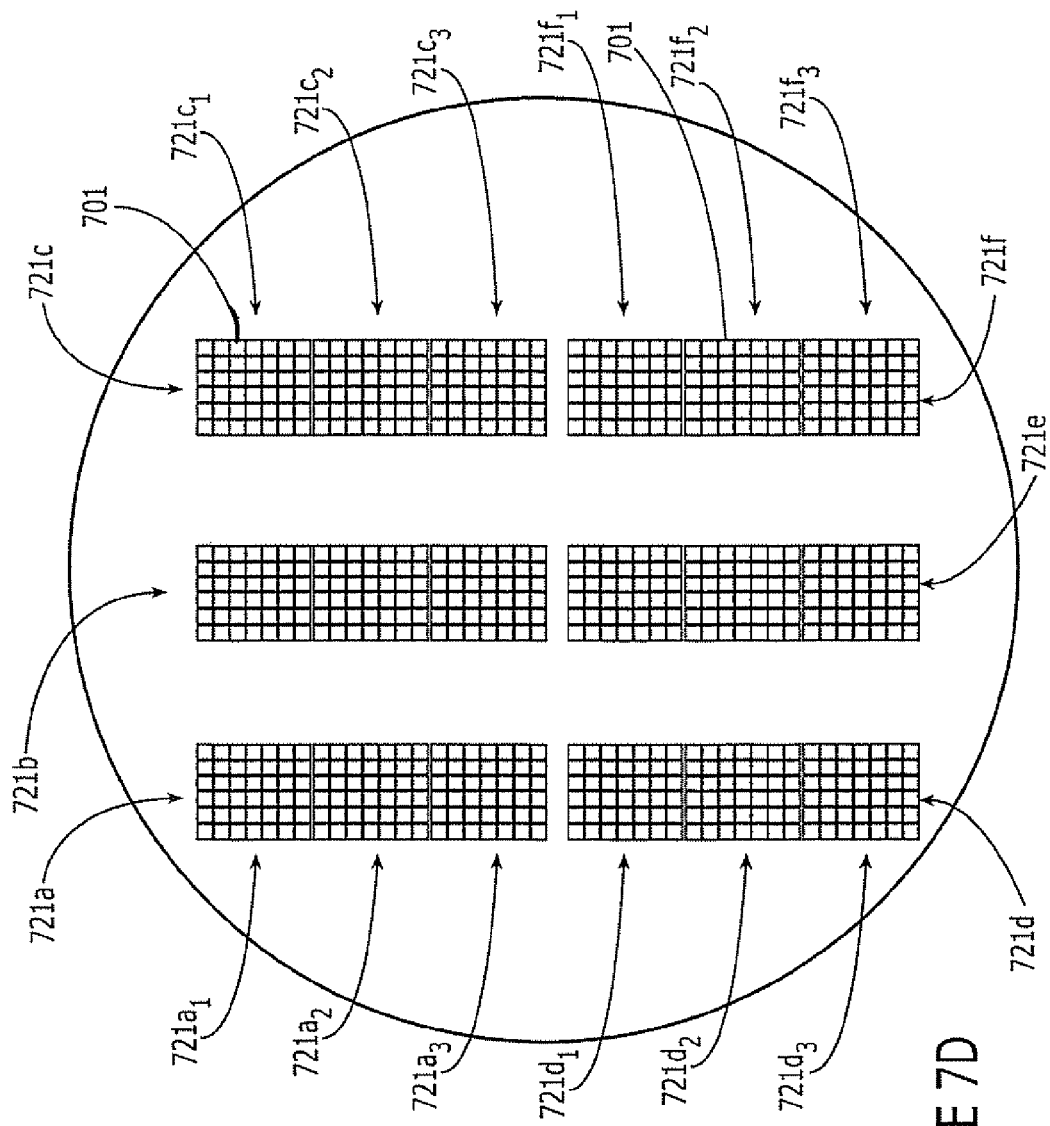
FIG. 7D is a plan view of an N-header substrate including conductive traces corresponding to the cross-sectional view of FIG. 7C according to some embodiments of the present invention.

FIG. 7D is a plan view of an N-header including substrate 703 and conductive traces 701 thereon as discussed above with respect to FIG. 7C. Due to the scale of FIG. 7D, the solder layers 717 are not separately shown in FIG. 7D. The pattern of conductive traces 701 of FIG. 7D corresponds to the pattern of epitaxial islands of FIG. 6C. As shown in FIG. 7D, the conductive traces 701 may be grouped into modules 721a-f, and each module 721a-f may include three sub-modules ($721a_{1-3}$, $721b_{1-3}$, ... $721f_{1-3}$) with each sub-module including an arrangement of conductive traces 701 for one thermoelectric device. More particularly, an arrangement of the conductive traces 701 in a sub-module may define an arrangement of the conductive traces in a subsequently formed thermoelectric device.

Figure 8A:
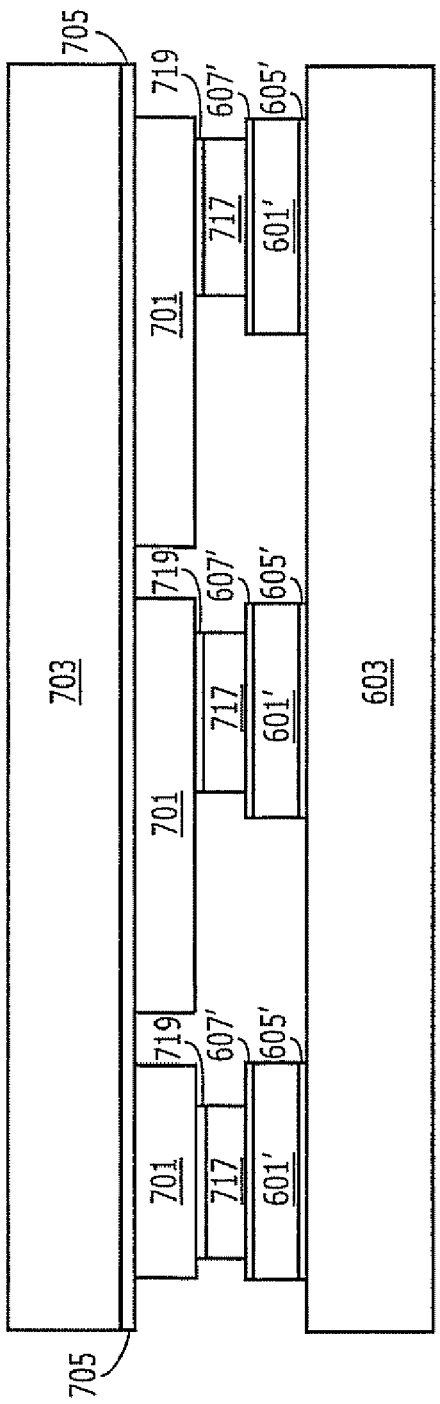

The epitaxial islands 601' of n-type thermoelectric material (also referred to as n-type thermoelectric elements) on the deposition substrate 603 of FIG. 6B may then be bonded to the conductive traces 701 of FIG. 7C using solder layers 717 as shown in FIG. 8A. More particularly, the solder layers 717 may be brought into contact with the solder wettable portions of ohmic contact layers 607' and subjected to a reflow operation. As discussed above, the solder layers 717 may be formed on the conductive traces 701 and then bonded to the ohmic contact layers 607'. According to other embodiments of the present invention, the solder layers 717 may be formed on the ohmic contact layers 607' and then bonded to the conductive traces 701.

As shown in FIG. 8A, edge portions of the ohmic contact layers 607' may remain free of the solder layers 717 after the bonding operation. For example, edge portions of the ohmic contact layer 607' may have solder wettable layers (such as layers of gold and/or nickel) removed therefrom so that solder non-wettable layers (such as layers of chromium and/or titanium) are exposed. Accordingly, the solder layers 717 may wet to central portions of the ohmic contact layer 607' where solder wettable layers are maintained without wetting to edge portions of the ohmic contact layer 607' where solder non-wettable layers have been removed. According to other embodiments of the present invention, solder wettable layers may extend across an entirety of the ohmic contact layers 607' so that solder layers 717 wet to entire surfaces of respective ohmic contact layers 607'.

Figure 9A:
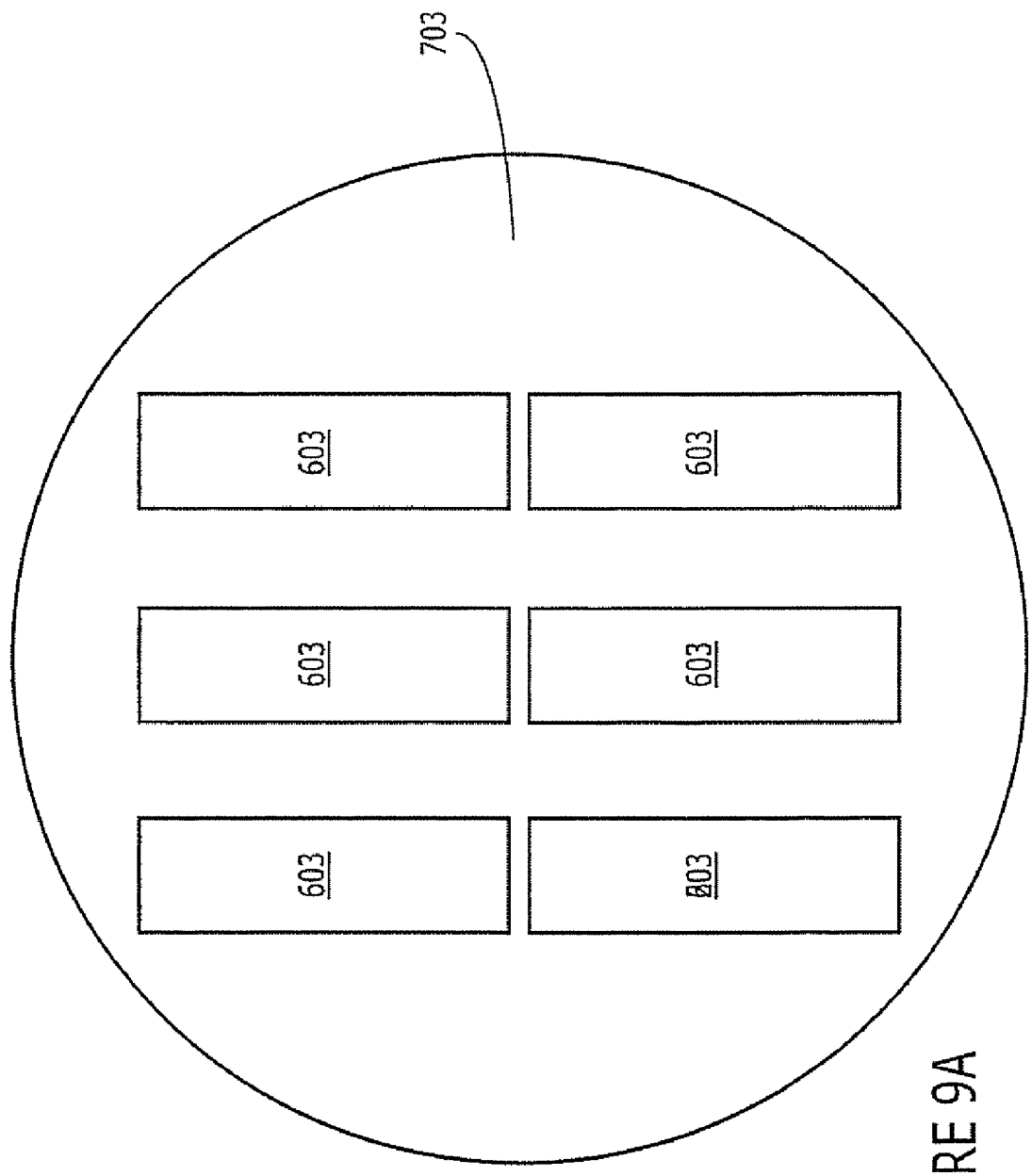
FIG. 9A is a plan view of an N-header substrate including deposition substrates bonded thereto corresponding to the cross-sectional view of FIG. 8A according to some embodiments of the present invention.

FIG. 9A is a plan view of a plurality of deposition substrates 603 bonded to a single N-header substrate 703, corresponding to the cross-sectional view of FIG. 8A. As shown in FIG. 9A, each deposition substrate 603 may include epitaxial islands of n-type thermoelectric material for three thermoelectric devices diced, for example, from the substrate 603 of FIG. 6C. By dicing modules from a larger deposition substrate, before bonding to the N-header substrate 703, thermal stress/strain resulting from different coefficients of thermal expansion of the N-header substrate 703 and the deposition substrate(s) 603 may be reduced. According to other embodiments of the present invention, the deposition substrate 603 of FIG. 2C may be diced so that each sub-module of epitaxial islands for a single thermoelectric device are separate so that 18 different deposition substrates 603 are bonded to the N-header substrate 703 of FIG. 9A to further reduce stress/strain due to different coefficients of thermal expansion. According to still other embodiments of the present invention, a single deposition substrate including epitaxial islands for all conductive traces on the N-header may be bonded to the N-header substrate 703 to reduce handling of separate deposition substrates.

Figure 8B:
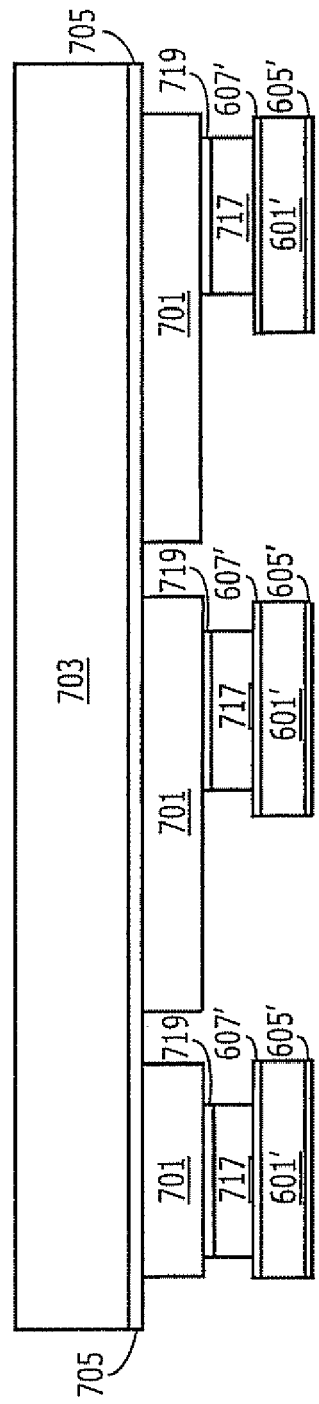

The deposition substrate 603 may then be selectively removed while maintaining the N-header substrate 703 as shown in FIG. 8B. If the deposition substrate 603 is a gallium arsenide substrate, for example, the deposition substrate 603 may be selectively removed using a mixture of $NH_4OH$, $H_2O_2$, and water.

As shown in FIG. 8C, the buffer layers 605' may be removed from the n-type thermoelectric elements 601', and contact metal layers 815 may be formed on exposed portions of the n-type thermoelectric elements 601'. The contact metal layer 815, for example, may include a layer of chromium having a thickness of about 50 Angstroms and a layer of gold having a thickness of about 500 Angstroms, with the layer of chromium between the layer of gold and the p-type thermoelectric elements 601'. Moreover, the contact metal layer may be formed using evaporation and/or sputtering. While not shown in FIG. 8C, contact metal may also be formed on exposed portions of substrate 703, seed layer 705, and/or traces 701.

A plating mask 817 may be formed on the contact metal layer 815 with portions of the contact metal layer 815 on the n-type thermoelectric elements 601' exposed through the plating mask 817. Layers of copper 819 and layers of solder 821 may be plated on the exposed portions of the contact metal layer 815, for example, using the seed layer 705 as a plating electrode so that plating current passes through thermoelectric elements 601'. Each of the layer of copper 819 and the layer of solder 821 may have a thickness in the range of about 4 micrometers to about 12 micrometers. Moreover, the layer of solder 821 may include tin solder, tin silver solder, lead tin solder, indium solder, and/or other single and/or multiple element solders.

The plating mask 817 may be removed as shown in FIG. 8D. As shown in FIG. 8D, portions of the n-type thermoelectric elements 601' may extend beyond the copper layers 819, and/or the solder layers 821. According to other embodiments of the present invention, the copper layers 819, and/or the solder layers 821 may extend substantially to edges of the respective n-type thermoelectric elements 601'. As further shown in FIG. 8D, portions of the seed layer 705 not covered by traces 701 may be removed to electrically isolate traces 701.

Figure 9B:
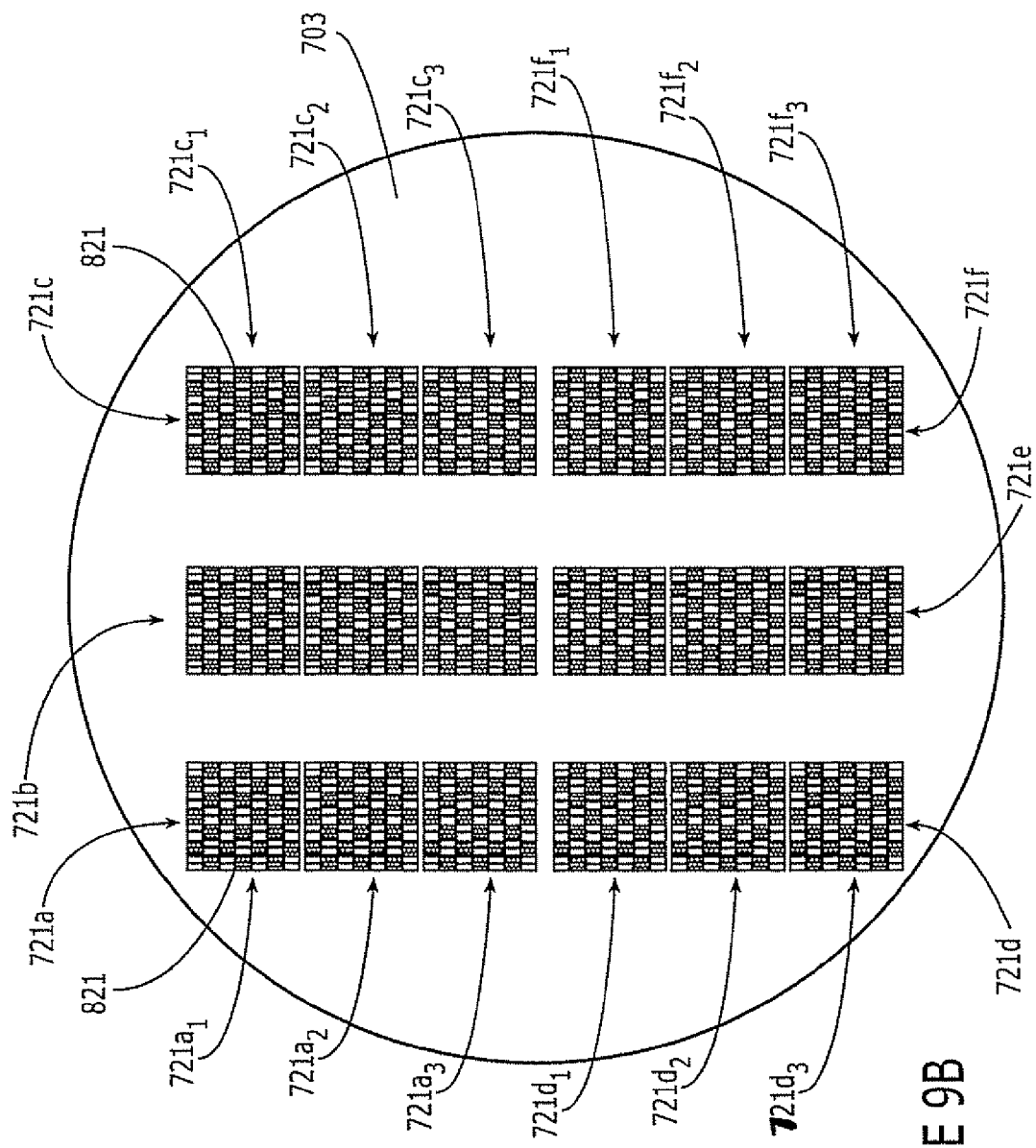
FIG. 9B is a plan view of an N-header substrate including n-type thermoelectric elements bonded thereto corresponding to the cross-sectional view of FIG. 8D according to some embodiments of the present invention.

FIG. 9B is a plan view of an N-header including substrate 703 and conductive traces 701 thereon as discussed above with respect to FIG. 7D with the addition of n-type thermoelectric elements and solder layers 821 as discussed above with respect to FIG. 8D. Due to the scale of FIG. 9B, the p-type thermoelectric elements 601' are not separately shown in FIG. 9B. As shown in FIG. 9B, the conductive traces 701 and respective n-type thermoelectric elements and solder layers 821 may be grouped into modules 721a-f, and each module 721a-f may include three sub-modules ($721a_{1-3}$, $721b_{1-3}$, ... $721f_{1-3}$) with each sub-module including an arrangement of conductive traces 701 and n-type thermoelectric elements for one thermoelectric device. More particularly, an arrangement of the conductive traces 701 and n-type thermoelectric elements in a sub-module may define an arrangement of the conductive traces and n-type thermoelectric elements in a subsequently formed thermoelectric device.

As discussed above with respect to FIGS. 8A-D and 9A-B, solder may be provided on n-type thermoelectric elements 601' for subsequent bonding to conductive traces on a P-header substrate. According to other embodiments of the present invention, solder may instead be provided on conductive traces of a P-header so that solder layers 821 may be omitted from the n-type thermoelectric elements 601' of FIGS. 8D and 9B. If the solder layers 821 are omitted from FIGS. 8D and 9B, contact metal layers 815' and/or copper layers 819 may provide solder wettable surfaces for subsequent solder bonding.

Figure 10A:
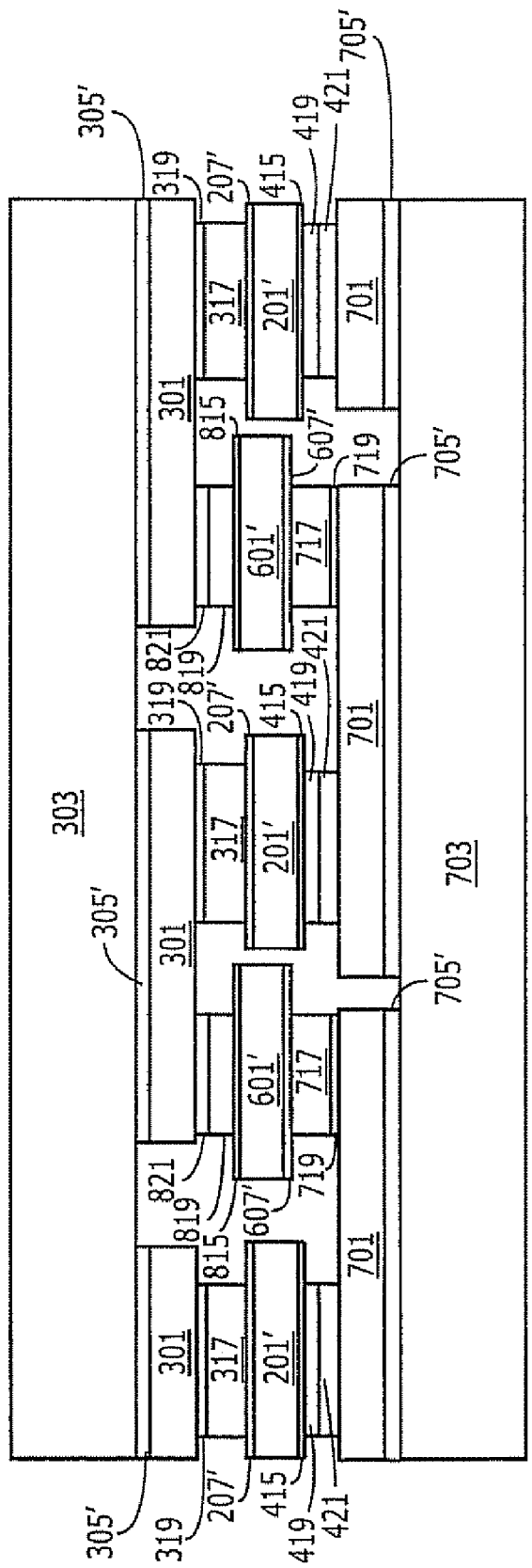
FIGS. 10A and 10B are respective cross-sectional and plan views of N-header and P-header substrates bonded together according to some embodiments of the present invention.
Figure 10B:
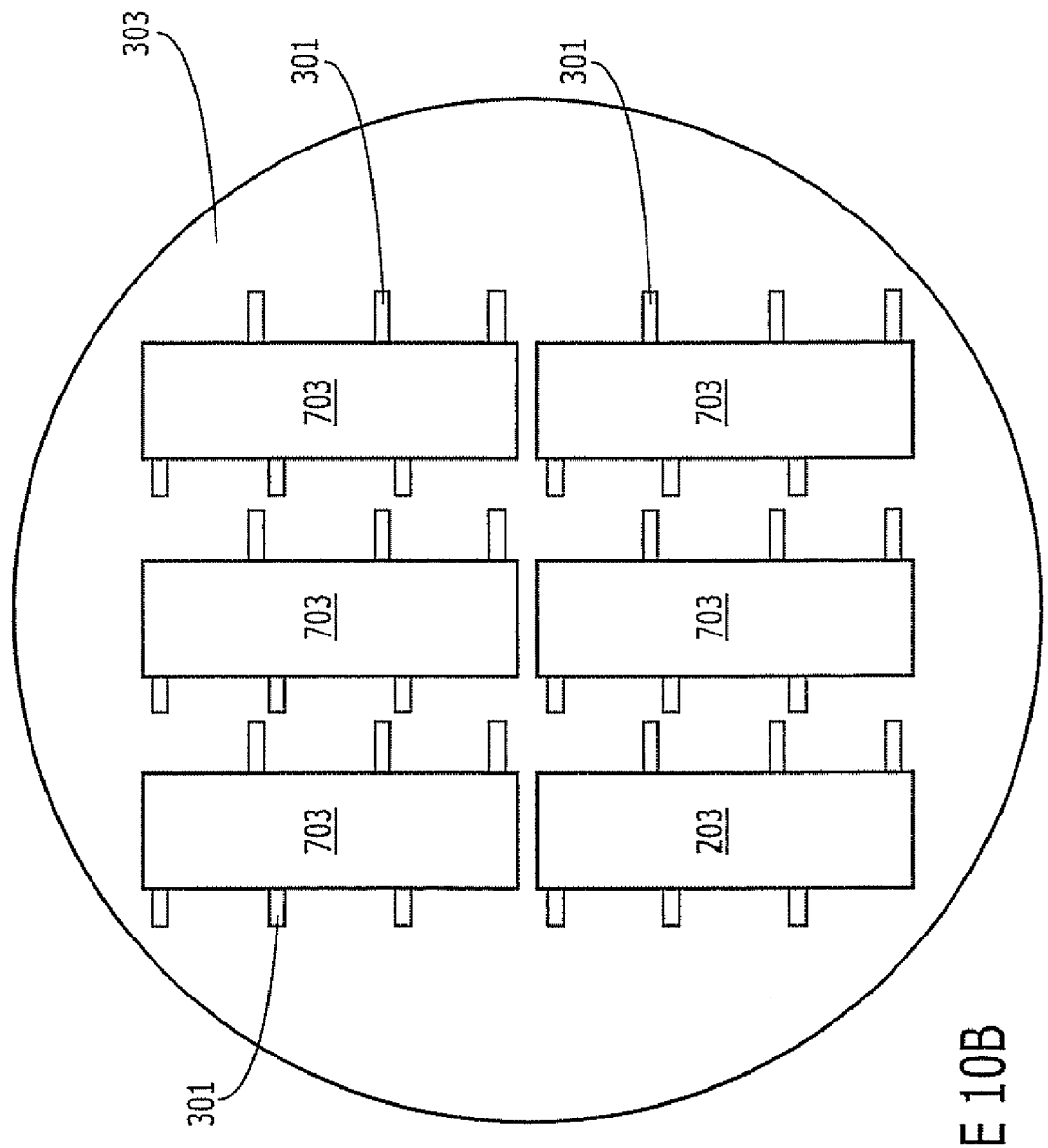

The P-header of FIG. 4D (including substrate 303 and p-type thermoelectric elements 201') and the N-header of FIG. 8D (including substrate 703 and n-type thermoelectric elements 601') may be bonded using solder layers 421 and 821 as shown in FIG. 10A. FIG. 10B is a plan view of a plurality of N-header substrates 703 bonded to a P-header substrate 303. As shown in FIG. 10B, each N-header substrate 703 may include n-type thermoelectric elements for three thermoelectric devices diced, for example, from the substrate 703 of FIG. 9B.

By dicing modules from a larger N-header substrate, before bonding to the P-header substrate 303, thermal stress/strain resulting from different coefficients of thermal expansion of the P-header substrate 303 and the N-header substrate(s) 703 may be reduced. According to other embodiments of the present invention, the N-header substrate 703 of FIG. 9B may be diced so that each sub-module of n-type thermoelectric elements for a single thermoelectric device are separate so that 18 different N-header substrates 703 are bonded to the P-header substrate 303 of FIG. 10B to further reduce stress/strain due to different coefficients of thermal expansion. According to still other embodiments of the present invention, a single N-header substrate 703 including n-type thermoelectric elements for all thermoelectric devices of the P-header substrate 303 may be bonded to the P-header substrate 303 to reduce handling of separate N-header substrates. According to still other embodiments of the present invention, the P-header substrate may be diced into a plurality of modules and/or sub-modules and bonded to a single N-header substrate. According to yet other embodiments of the present invention, both the N-header and P-header substrates may be diced into modules and/or sub-modules before bonding.

Figure 11A:
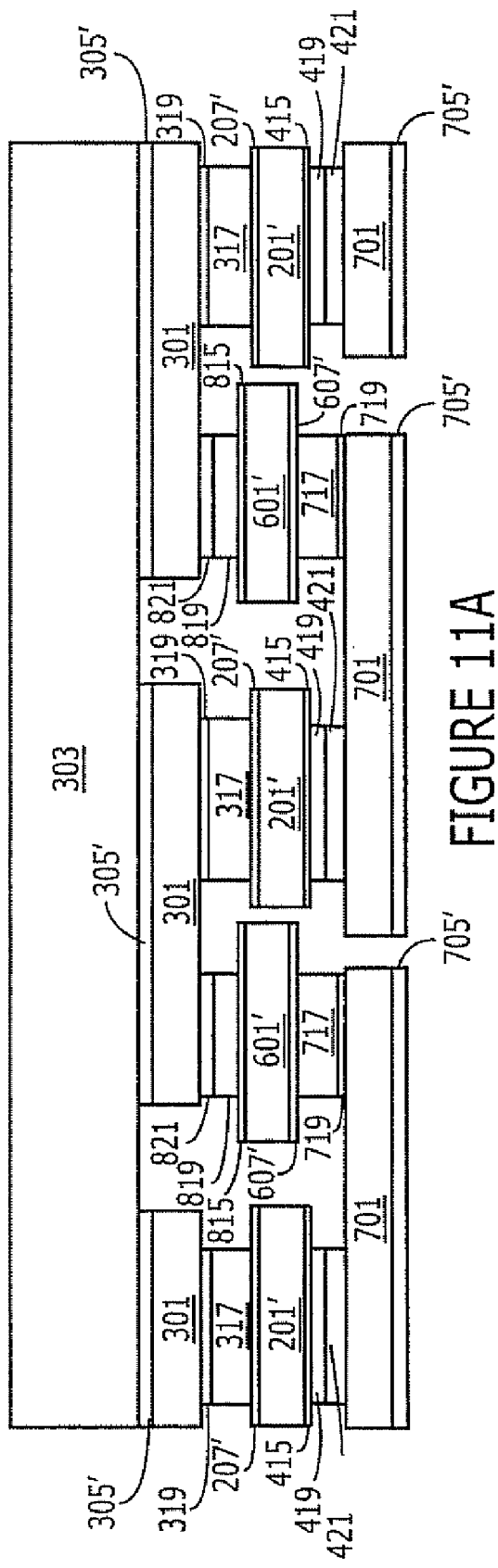
FIGS. 11A and 11B are respective cross-sectional and plan views of a thermoelectric device after removing the N-header substrate according to some embodiments of the present invention.
Figure 11B:
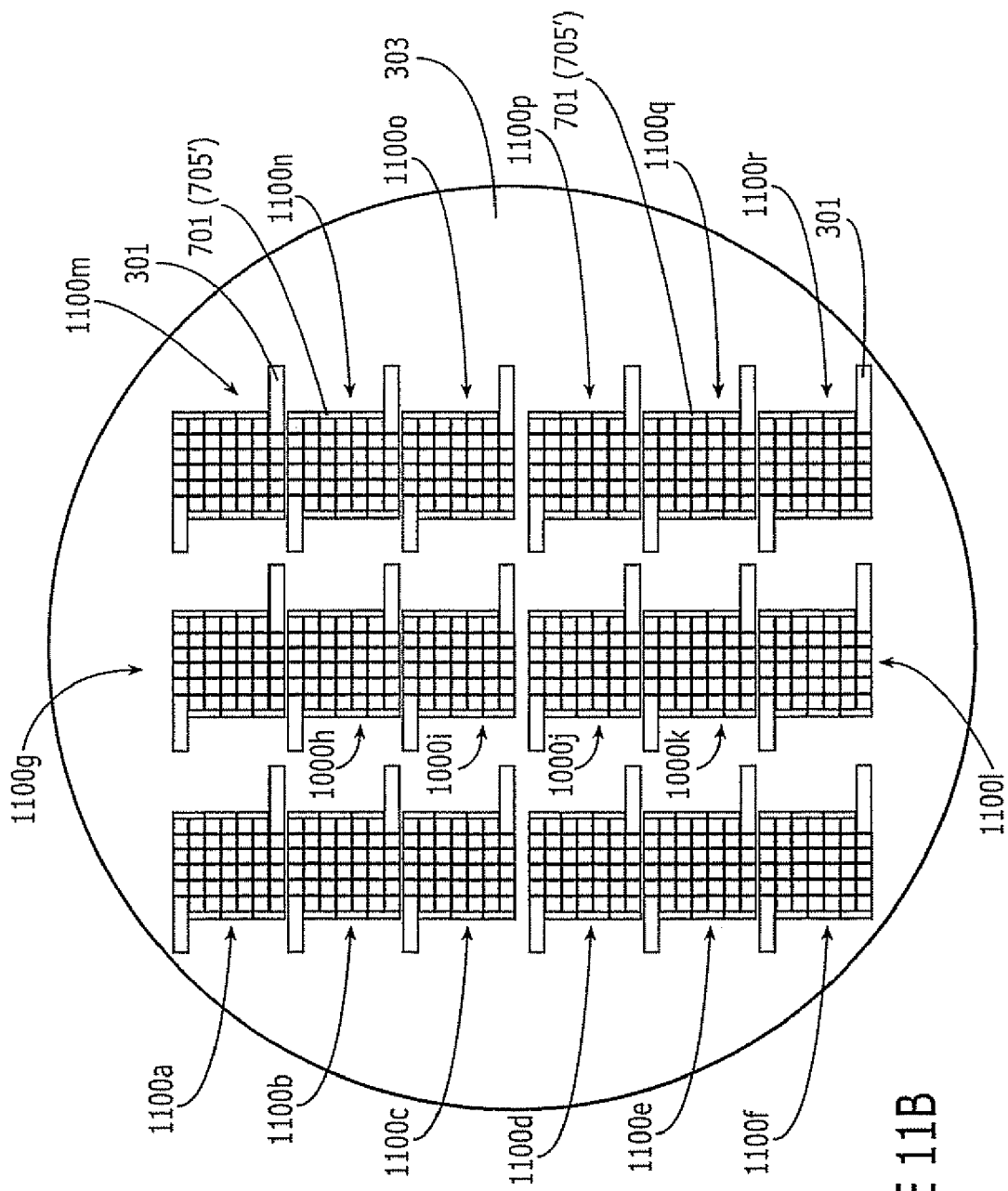

The N-header substrate(s) 703 may then be removed as shown in FIGS. 11A and 11B. Accordingly, the p-type thermoelectric elements 201' and the n-type thermoelectric elements 601' may be sandwiched between the conductive traces 301 and 701. As shown in the plan view of FIG. 11B, a plurality of completed thermoelectric devices 1100a-r may be formed on a single P-header substrate 303. The P-header substrate 303 may then be diced to separate each of the separate thermoelectric devices 1100a-r, and the exposed conductive traces, such as conductive traces 701 (including patterned seed layers 705') may be thermally coupled to a surface (such as an integrated circuit substrate) to be heated and/or cooled. By providing that the P-header substrate 303 and the N-header substrate 703 comprise different materials, one of the P-header or N-header substrates may be selectively removed while maintaining the other.

As discussed herein, the electrically conductive traces 701 may be defined to include the patterned seed layers 705' thereon. According to embodiments of the present invention, exposed surfaces of the thermally conductive traces may have a planarity defined by a planarity of a surface of the sacrificial N-header substrate 703 on which the electrically conductive traces 701 are formed. Accordingly, exposed surfaces of the electrically conductive traces 701 of a completed thermoelectric device 1100a-r may be within about 10 micrometers of a same plane, and more particularly, within about 5 micrometers of a same plane, and still more particularly, within about 2 micrometers or even within about 1 micrometer of a same plane. Moreover, exposed surfaces of electrically conductive traces 701 of different ones of the completed thermoelectric devices 1100a-r may be within about 10 micrometers of a same plane, and more particularly, within about 5 micrometers of a same plane, and still more particularly, within about 2 micrometers or even within about 1 micrometer of a same plane.

In addition or in an alternative, the P-header substrate may be removed so that the electrically conductive traces 301 (defined to include the patterned seed layers 305') are exposed. If the P-header substrate is removed, exposed surfaces of the electrically conductive traces 301 of a completed thermoelectric device 1100a-r may be within about 10 micrometers of a same plane, and more particularly, within about 5 micrometers of a same plane, and still more particularly, within about 2 micrometers or even within about 1 micrometer of a same plane. Moreover, exposed surfaces of electrically conductive traces 701 of different ones of the completed thermoelectric devices 110a-r may be within about 10 micrometers of a same plane, and more particularly, within about 5 micrometers of a same plane, and still more particularly, within about 2 micrometers or even within about 1 micrometer of a same plane. By removing one or both of the P-header and/or N-header header substrates, a thermal resistance between the thermoelectric elements and a surface being heated/cooled may be reduced, and/or a thermal resistance between the thermoelectric elements and a heat source/sink may be reduced. In addition, a space required to accommodate the thermoelectric device may be reduced. Moreover, by providing a high degree of planarity of exposed surfaces of thermally conductive traces, improved thermal and/or mechanical contact may be provided.

Figure 12:
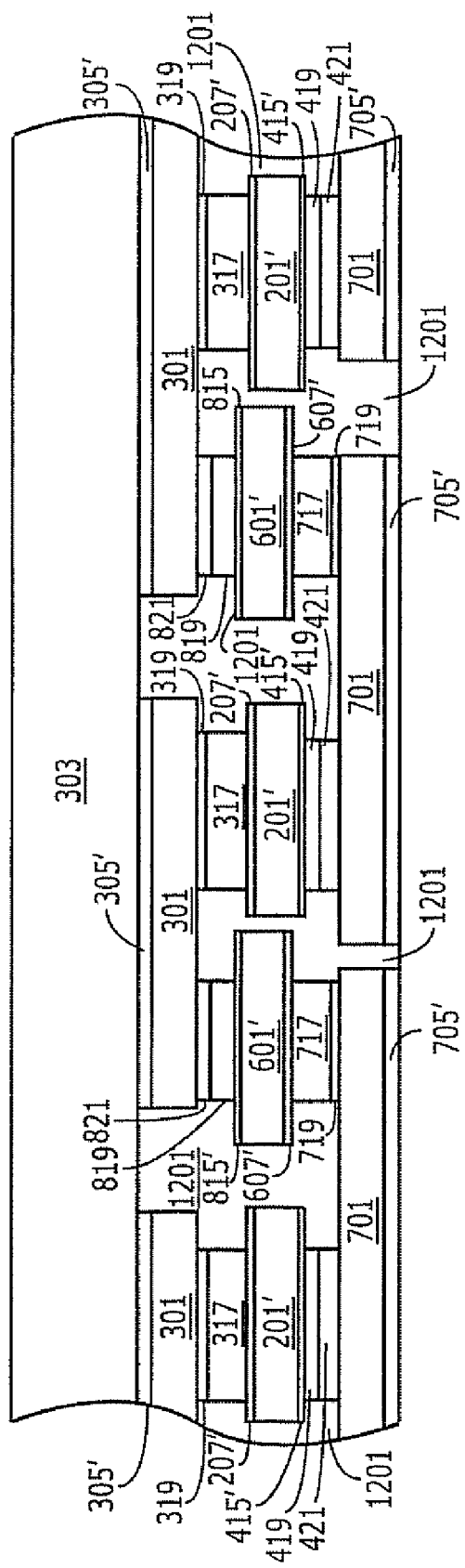
FIG. 12 is a cross-sectional view of a thermoelectric device including an underfill according to some embodiments of the present invention.

According to additional embodiments of the present invention, an underfill material (also referred to as a support material) may be provided between the P-header substrate 303 and the N-header substrate 703 of FIG. 10A before removing one or both of the P-header substrate 303 and/or the N-header substrate 703. More particularly, the underfill material may fill spaces between the conductive traces 701 (defined to include patterned seed layers 705'), between the conductive traces 301 (defined to include patterned seed layers 305'), and/or between the n-type and p-type thermoelectric elements 601' and 201' and the solder layers 317, 717, 421, and 821. As shown in FIG. 12, the underfill material 1201 may thus fill gaps between exposed surfaces of the conductive traces 701. Moreover, a planarity of the surface including the exposed conductive traces 701 (defined to include the patterned seed layers 705') and the underfill material may be defined by a surface of the N-header substrate 703. Accordingly, an exposed surface defined by the electrically conductive traces 701 of a completed thermoelectric device and underfill material therebetween may be within about 10 micrometers of a same plane, and more particularly, within about 5 micrometers of a same plane, and still more particularly, within about 2 micrometers or even within about 1 micrometer of a same plane.

In addition or in an alternative, the P-header substrate 303 may be removed after providing the underfill material 1201. Accordingly, a planarity of the surface including the exposed conductive traces 301 (defined to include the patterned seed layers 305') and the underfill material 1201 may be defined by a surface of the P-header substrate 303. Accordingly, an exposed surface defined by the electrically conductive traces 301 of a completed thermoelectric device and underfill material 1201 therebetween may be within about 10 micrometers of a same plane, and more particularly, within about 5 micrometers of a same plane, and still more particularly, within about 2 micrometers or even within about 1 micrometer of a same plane. If both of the P-header substrate 303 and the N-header substrate 703 are removed after providing the underfill material 1201 as shown in FIG. 3, the underfill material 1201 may provide increased strength for the thermoelectric device.

The underfill material 1201 may be an epoxy material that is provided between the P-header substrate 303 and the N-header substrate 703 of FIG. 10A as a liquid and then cured before removing either of the header substrates 303 and/or 703. Moreover, the underfill material 1201 may be electrically and thermally insulating.

According to still other embodiments of the present invention, an electrically insulating matrix may be provided between the conductive traces 301 and/or between the conductive traces 701. Electrically insulating matrixes between conductive traces are discussed in U.S. Patent Publication No. 2006/0289050 to Alley et al., the disclosure of which is hereby incorporated herein in its entirety by reference. Such electrically insulating matrixes may be provided between traces 301 and/or 701 without providing the electrically insulating matrix or other underfill between thermoelectric elements. According to still other embodiments of the present invention, electrically insulating matrixes may be provided between traces 301 and/or 701, and the same or another underfill material may be provided between thermoelectric elements. As used herein, such electrically insulating matrixes between traces 301 and/or 701 may provide planarity as discussed above with respect to underfill material 1201 and may be referred to as underfill.

As shown in FIGS. 10A, 11A, 12, and 13, a thermoelectric device according to embodiments of the present invention may include pluralities of p-type thermoelectric elements 201' and pluralities of n-type thermoelectric elements 601' that are electrically connected in series and that are thermally connected in parallel. Accordingly, electrical current passes through the p-type thermoelectric elements 201' in a first direction and through the n-type thermoelectric elements 601' in a second direction, and the first and second directions are opposite directions. Thermoelectric devices according to embodiments can thus pump heat from one side or the device to the other, and/or convert a temperature differential on opposite sides of the thermoelectric device into electrical energy.

Figure 13:
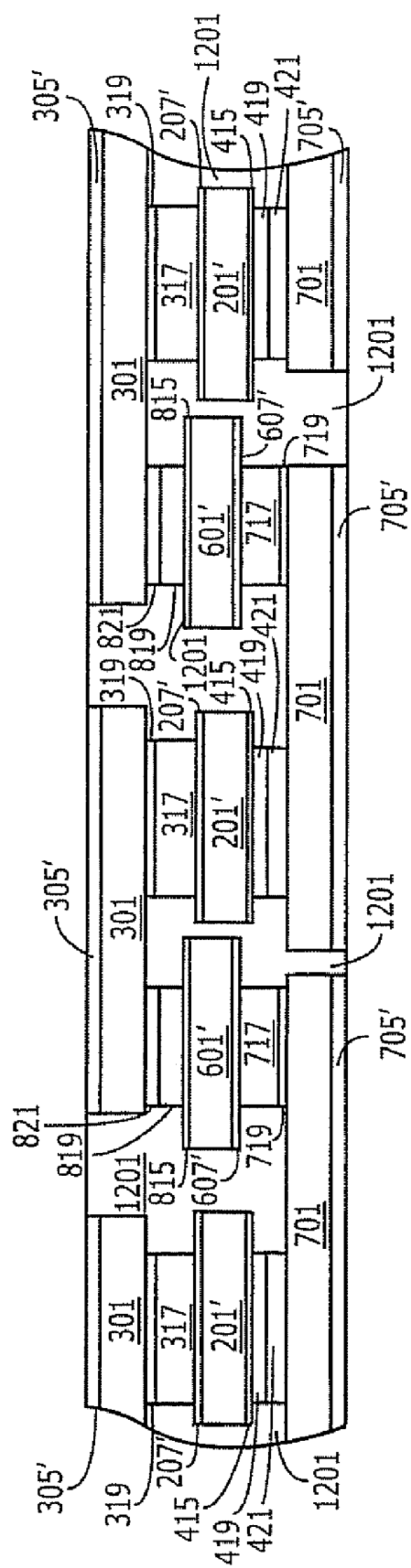
FIG. 13 is a cross-sectional view of a thermoelectric device after removing both N-header and P-header substrates according to some embodiments of the present invention.

While not shown in FIGS. 12 and 13, a thin dielectric layer may be provided on the exposed surfaces of the electrically conductive traces 701 (defined to include the patterned seed layers 705') and the underfill material 1201. In addition, a thin metal layer may be provided on the thin dielectric layer so that the thin dielectric layer is between the thin metal layer and the electrically conductive traces 701. The thin metal layer may provide improved thermal contact with a surface being heated and/or cooled and/or with a heat sink/source, and the thin dielectric layer may provide electrical isolation between the electrically conductive traces 701. Thin dielectric and metal layers may similarly be provided on exposed surfaces of the electrically conductive traces 301 (defined to include patterned seed layers 305') and underfill material 1201 if the header substrate 303 is removed as shown in FIG. 13. Moreover, a combined thickness of such a thin dielectric layer and thin metal layer may be less than about 100 micrometers, and more particularly, greater than about 50 micrometers. Stated in other words, surfaces of the electrically conductive traces opposite the thermoelectric elements may be free of materials having a thickness greater than about 100 micrometers (and more particularly about 50 micrometers) spanning multiple ones of the conductive traces.

According to some embodiments of the present invention, thin dielectric and metal layers may be formed on exposed conductive traces after removing the respective header substrate. According to other embodiments of the present invention, thin dielectric and metal layers may be formed on a surface of the respective header substrate before forming the conductive traces thereon. After bonding the two header substrates with the thermoelectric elements therebetween, the header substrate with the thin dielectric and metal layers previously formed thereon may be selectively removed while maintaining the thin dielectric and metal layers thereon.

According to some additional embodiments of the present invention, metal posts (also referred to as metal studs) may be provided between ohmic contact layers 207' (on p-type thermoelectric elements 201') and solder layers 317, and between ohmic contact layers 607' (on n-type thermoelectric elements 601') and solder layers 717. The metal posts may be copper posts having a thickness, for example, of about 5 micrometers or greater. Metal posts on the ohmic contact layer 207', for example, may be selectively plated on the ohmic contact layer 207 of FIG. 2A before patterning the layer 201 of thermoelectric material. Similarly, metal posts on the ohmic contact layer 607' may be selectively plated on the ohmic contact layer 607 of FIG. 6A before patterning the layer 601 of thermoelectric material. According to other embodiments of the present invention, metal posts may be formed on ohmic contact layers 201' and/or 601' after patterning layers 201 and/or 601. Metal posts, for example, may isolate thermoelectric elements 201' and/or 601' from respective solder layers 317 and/or 717.

While the present invention has been particularly shown and described with reference to embodiments thereof, it will be understood by those of ordinary skill in the art that various changes in form and details may be made therein without departing from the spirit and scope of the present invention as defined by the following claims.

That which is claimed is:

1. A method of forming a thermoelectric device, the method comprising:
   forming a first plurality of conductive metal traces;
   bonding a first plurality of thermoelectric semiconductor elements to the first plurality of conductive metal traces, wherein the first plurality of thermoelectric semiconductor elements have a first semiconductor conductivity type;
   bonding a second plurality of thermoelectric semiconductor elements to the first plurality of conductive metal traces, wherein the second plurality of thermoelectric semiconductor elements have a second semiconductor conductivity type opposite the first semiconductor conductivity type; and
   providing a second plurality of conductive metal traces on the first and second pluralities of thermoelectric semiconductor elements so that the first and second pluralities of thermoelectric semiconductor elements are between the first and second pluralities of conductive metal traces, wherein surfaces of the second plurality of conductive metal traces opposite the first and second pluralities of thermoelectric semiconductor elements are free of layers having a thickness greater than about 100 micrometers and spanning multiple ones of the second plurality of conductive metal traces wherein first current paths are defined through each of the first plurality of thermoelectric semiconductor elements between respective conductive metal traces of the first and second pluralities of conductive metal traces with the first current paths being free of the second semiconductor conductivity type, and wherein second current paths are defined through each of the second plurality of thermoelectric semiconductor elements between respective conductive metal traces of the first and second pluralities of conducive metal traces with the second current paths being free of the first semiconductor conductivity type wherein surfaces of the first plurality of conductive metal traces opposite the first and second pluralities of thermoelectric semiconductor elements are free of layers having a thickness greater than about 100 micrometers and spanning multiple ones of the first plurality of conductive metal traces.

2. A method according to claim 1 wherein the surfaces of the second plurality of conductive metal traces opposite the first and second pluralities of thermoelectric semiconductor elements are free of layers having a thickness greater than about 50 micrometers and spanning multiple ones of the second plurality of conductive metal traces.

3. A method according to claim 1 wherein the surfaces of the second plurality of conductive metal traces opposite the first and second pluralities of thermoelectric semiconductor elements are substantially coplanar so that the surfaces of the second plurality of conductive metal traces are arranged within about 10 micrometers of a same plane.

4. A method according to claim 1 wherein the surfaces of the second plurality of conductive metal traces opposite the first and second pluralities of thermoelectric semiconductor elements are substantially coplanar so that the surfaces of the second plurality of conductive metal traces are arranged within about 5 micrometer of a same plane.

5. A method according to claim 1 wherein forming the first plurality of conductive metal traces comprises forming the first plurality of conductive metal traces on a header substrate so that the first plurality of conductive metal traces are between the header substrate and the first and second pluralities of thermoelectric semiconductor elements.

6. A method according to claim 1 further comprising:
   providing a support material between ones of the first plurality of conductive metal traces and between ones of the second plurality of conductive metal traces so that the support material provides mechanical coupling between the first plurality of conductive metal traces and between the second plurality of conductive metal traces wherein the support material is electrically insulating.

7. A method according to claim 1 further comprising:
   providing a support material between ones of the first and second pluralities of thermoelectric semiconductor elements so that the support material provides mechanical coupling between the first and second pluralities of thermoelectric semiconductor elements, wherein the support material is electrically insulating.

8. A method according to claim 1 wherein surfaces of the second plurality of conductive metal traces opposite the first and second pluralities of thermoelectric semiconductor elements are exposed.

9. A method according to claim 1 wherein the surfaces of the second plurality of conductive metal traces opposite the first and second pluralities of thermoelectric semiconductor elements are substantially coplanar.

10. A method according to claim 1 further comprising:
    providing a support material between ones of the first plurality of conductive metal traces so that the support material provides mechanical coupling between the first plurality of conductive metal traces wherein the support material is electrically insulating.

11. A method according to claim 1 further comprising:
    providing a support material between ones of the second plurality of conductive metal traces so that the support material provides mechanical coupling between the second plurality of conductive metal traces wherein the support material is electrically insulating.

12. A thermoelectric structure comprising:
    a first plurality of conductive metal traces;
    a first plurality of thermoelectric semiconductor elements bonded to the first plurality of conductive metal traces, wherein the first plurality of thermoelectric semiconductor elements have a first semiconductor conductivity type;
    a second plurality of thermoelectric semiconductor elements bonded to the first plurality of conductive metal traces, wherein the second plurality of thermoelectric semiconductor elements have a second semiconductor conductivity type opposite the first semiconductor conductivity type; and
    a second plurality of conductive metal traces on the first and second pluralities of thermoelectric semiconductor elements so that the first and second pluralities of thermoelectric semiconductor elements are between the first and second pluralities of conductive metal traces, and wherein surfaces of the second plurality of conductive metal traces opposite the first and second pluralities of thermoelectric semiconductor elements are free of layers having a thickness greater than about 100 micrometers and spanning multiple ones of the second plurality of conductive metal traces wherein first current paths are defined through each of the first plurality of thermoelectric semiconductor elements between respective conductive metal traces of the first and second pluralities of conductive metal traces with the first current paths being free of the second semiconductor conductivity type, and wherein second current paths are defined through each of the second plurality of thermoelectric semiconductor elements between respective conductive metal traces of the first and second pluralities of conducive metal traces with the second current paths being free of the first semiconductor conductivity type wherein surfaces of the first plurality of conductive metal traces opposite the first and second pluralities of thermoelectric semiconductor elements are free of layers having a thickness greater than about 50 micrometers and spanning multiple ones of the first plurality of conductive metal traces.

13. A thermoelectric device according to claim 12 wherein the surfaces of the second plurality of conductive metal traces opposite the first and second pluralities of thermoelectric semiconductor elements are free of layers having a thickness greater than about 50 micrometers spanning multiple ones of the second plurality of conductive metal traces.

14. A thermoelectric structure according to claim 12 wherein the surfaces of the second plurality of conductive metal traces opposite the first and second pluralities of thermoelectric semiconductor elements are substantially coplanar so that the surfaces of the second plurality of conductive metal traces are arranged within about 10 micrometers of a same plane.

15. A thermoelectric structure according to claim 12 wherein the surfaces of the second plurality of conductive metal traces opposite the first and second pluralities of thermoelectric semiconductor elements are substantially coplanar so that the surfaces of the second plurality of conductive metal traces are arranged within about 5 micrometer of a same plane.

16. A thermoelectric structure according to claim 12 further comprising:
a header substrate with the first plurality of conductive metal traces on the header substrate so that the first plurality of conductive metal traces are between the header substrate and the first and second pluralities of thermoelectric semiconductor elements.

17. A thermoelectric structure according to claim 12 further comprising:
a support material between ones of the first plurality of conductive metal traces and between ones of the second plurality of conductive metal traces so that the support material provides mechanical coupling between the first plurality of conductive metal traces and between the second plurality of conductive metal traces wherein the support material is electrically insulating.

18. A thermoelectric structure according to claim 12 further comprising:
a support material between ones of the first and second pluralities of thermoelectric semiconductor elements so that the support material provides mechanical coupling between the first and second pluralities of thermoelectric semiconductor elements, wherein the support material is electrically insulating.

19. A thermoelectric structure according to claim 12 wherein the surfaces of the second plurality of conductive metal traces opposite the first and second pluralities of thermoelectric semiconductor elements are substantially coplanar.

20. A thermoelectric structure according to claim 12 further comprising:
a support material between ones of the first plurality of conductive metal traces so that the support material provides mechanical coupling between the first plurality of conductive metal traces wherein the support material is electrically insulating.

21. A thermoelectric structure according to claim 12 further comprising:
a support material between ones of the second plurality of conductive metal traces so that the support material provides mechanical coupling between the second plurality of conductive metal traces wherein the support material is electrically insulating.

* * * * *